(12) United States Patent
Hayakawa et al.

(10) Patent No.: US 8,691,645 B2
(45) Date of Patent: Apr. 8, 2014

(54) METHOD OF MANUFACTURING CONVEX SHAPED THIN-FILM TRANSISTOR DEVICE

(75) Inventors: Yukio Hayakawa, Fukushima-Ken (JP); Hiroyuki Nansei, Fukushima-Ken (JP)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 13/572,487

(22) Filed: Aug. 10, 2012

(65) Prior Publication Data

US 2012/0309138 A1 Dec. 6, 2012

Related U.S. Application Data

(62) Division of application No. 12/002,728, filed on Dec. 17, 2007, now Pat. No. 8,264,029.

(30) Foreign Application Priority Data

Dec. 27, 2006 (JP) ................................. 2006-353415

(51) Int. Cl.
*H01L 21/8238* (2006.01)
*H01L 21/336* (2006.01)
*H01L 21/76* (2006.01)

(52) U.S. Cl.
USPC ........... 438/216; 438/261; 438/264; 438/287; 438/424

(58) Field of Classification Search
None
See application file for complete search history.

(56) References Cited

U.S. PATENT DOCUMENTS

| 6,627,945 | B1* | 9/2003 | Tripsas et al. | 257/315 |
|---|---|---|---|---|
| 6,777,741 | B2* | 8/2004 | Rabkin et al. | 257/315 |
| 2002/0195646 | A1 | 12/2002 | Tseng | |
| 2006/0261405 | A1 | 11/2006 | Forbes | |
| 2006/0273404 | A1* | 12/2006 | Scheuerlein | 257/390 |
| 2007/0045722 | A1 | 3/2007 | Lee | |
| 2007/0252192 | A1 | 11/2007 | Mokhlesi et al. | |
| 2008/0142875 | A1* | 6/2008 | Lee et al. | 257/324 |

FOREIGN PATENT DOCUMENTS

WO 2006130801 A2 7/2006

OTHER PUBLICATIONS

Kee-Chan Park et al; "A New Poly-Si Thin-Film Transistor with Poly-Si/A-Si Double Active Layer" IEEE Election Device Letters, IEEE Service Center, New York, NY, US, vol. 21, No. 10, Oct. 1, 2000, XP011018846 ISSN: 0741-3106.

* cited by examiner

*Primary Examiner* — Michael Jung

(57) ABSTRACT

The present invention provides a semiconductor device that has a shorter distance between the bit lines and easily achieves higher storage capacity and density, and a method of manufacturing such a semiconductor device. The semiconductor device includes: first bit lines formed on a substrate; an insulating layer that is provided between the first bit lines on the substrate, and has a higher upper face than the first bit lines; channel layers that are provided on both side faces of the insulating layer, and are coupled to the respective first bit lines; and charge storage layers that are provided on the opposite side faces of the channel layers from the side faces on which the insulating layers are formed.

14 Claims, 18 Drawing Sheets

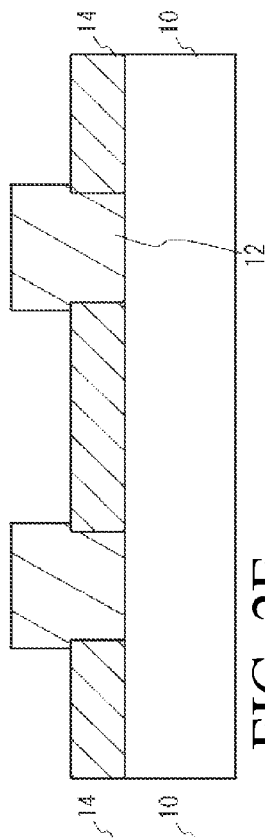
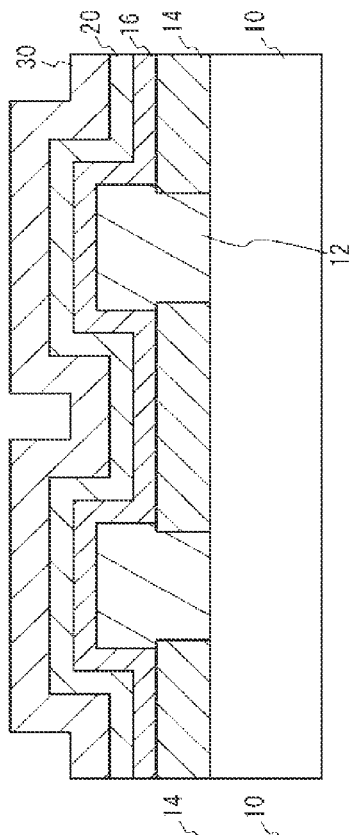
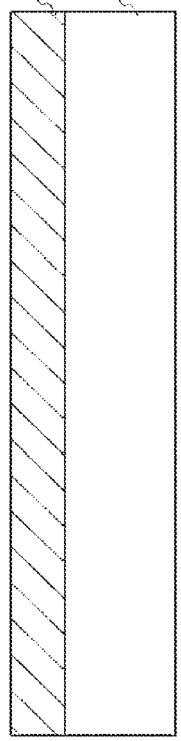
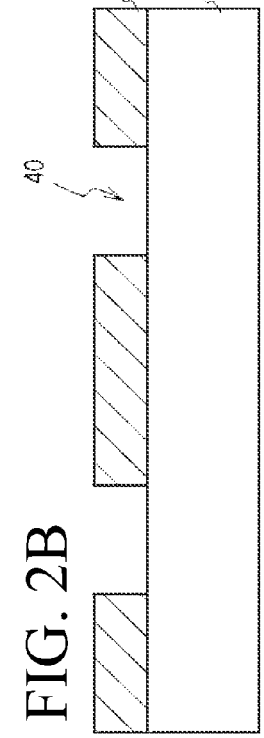
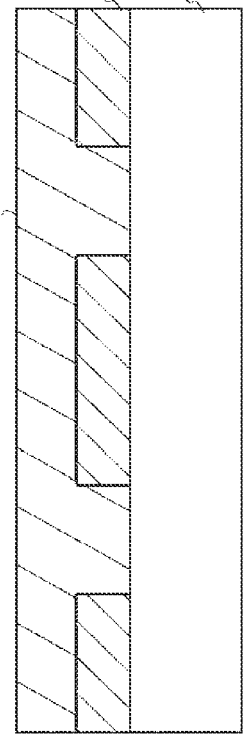

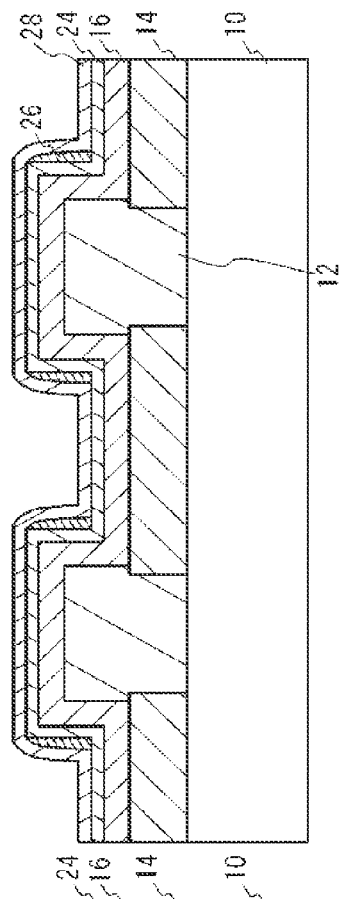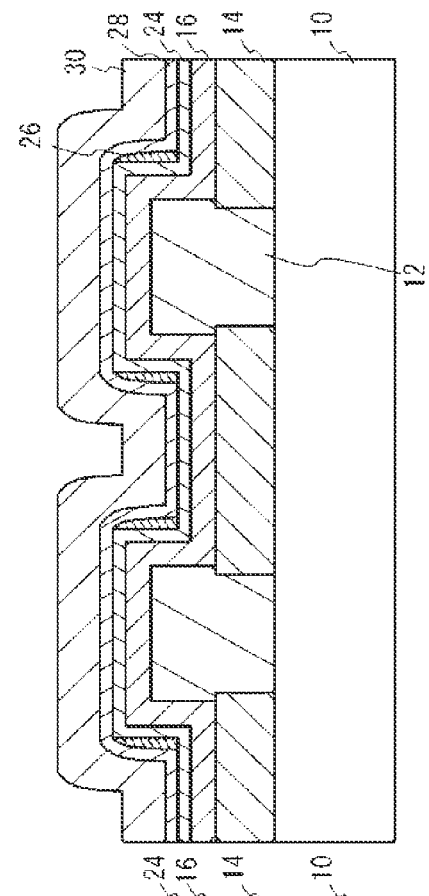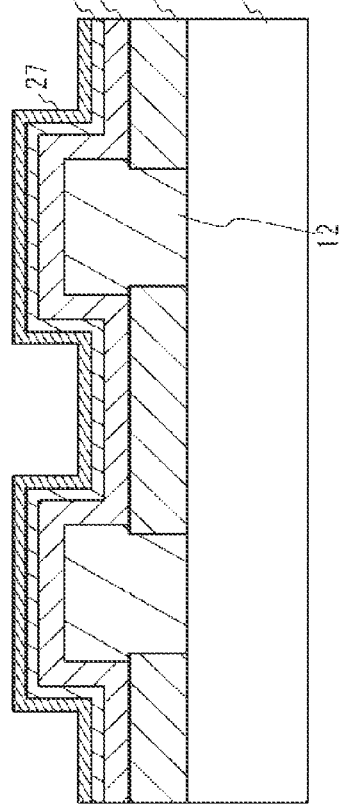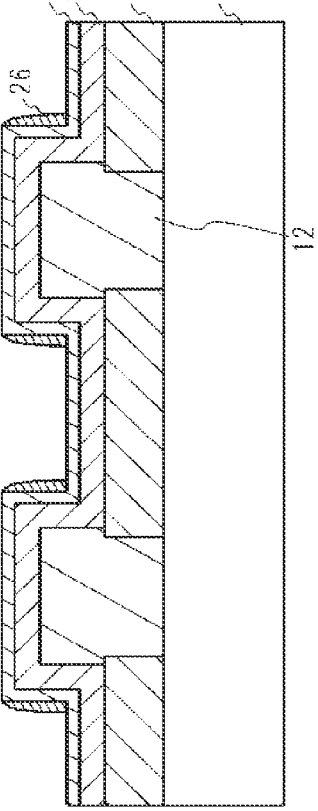

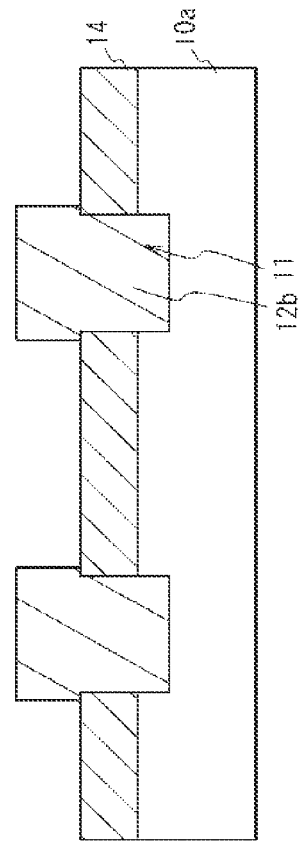
FIG. 8A
FIG. 8B
FIG. 8C
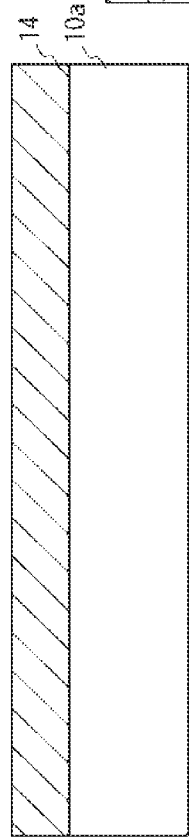
FIG. 8D
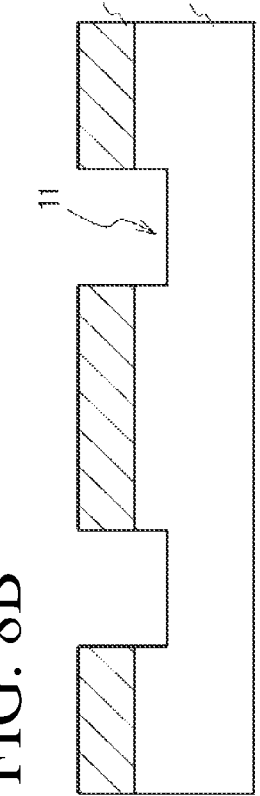
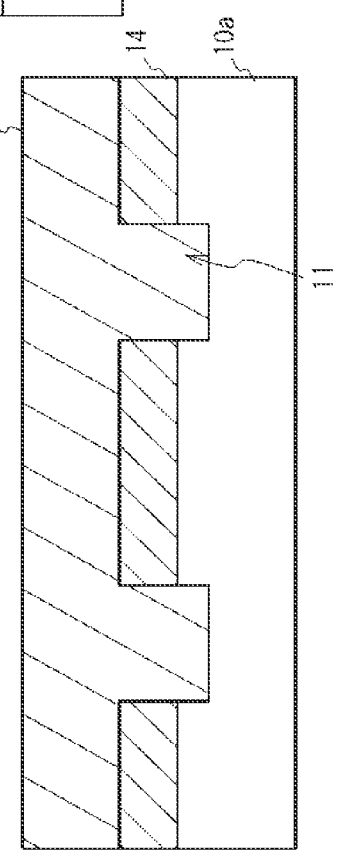
FIG. 8E

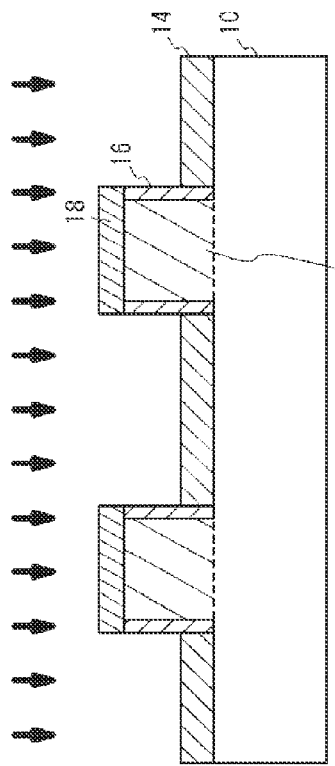
FIG. 10D
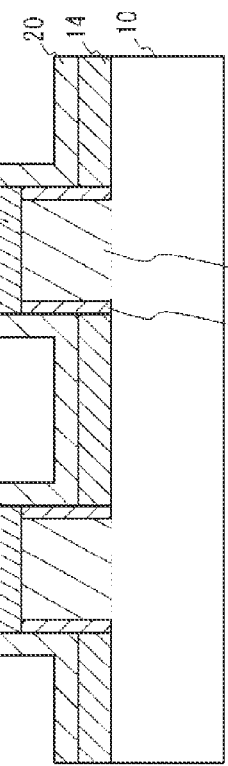
FIG. 10E
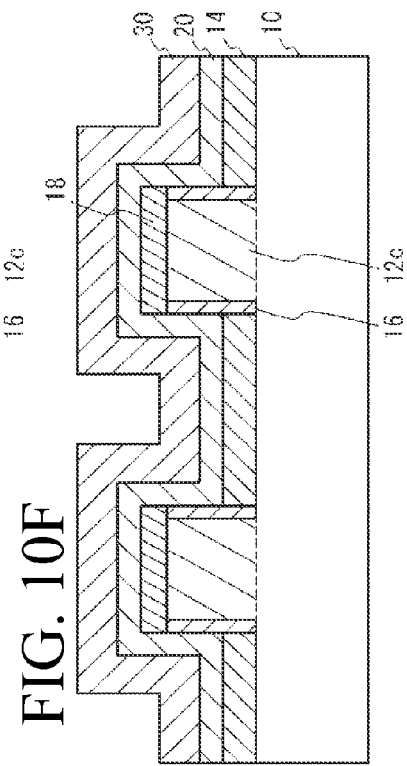
FIG. 10F
FIG. 10A
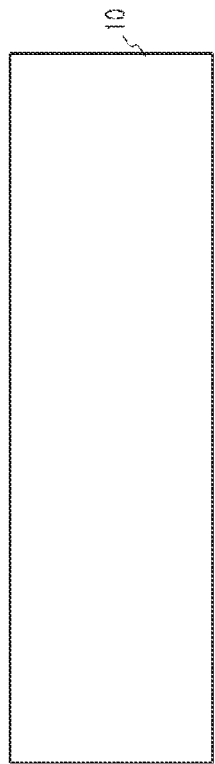
FIG. 10B
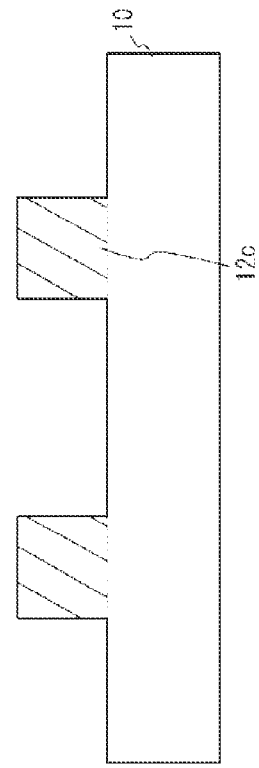
FIG. 10C
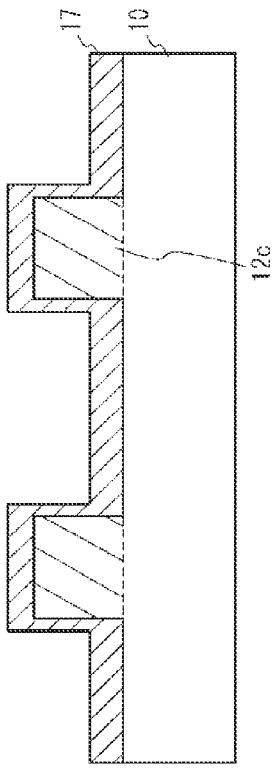

METHOD OF MANUFACTURING CONVEX SHAPED THIN-FILM TRANSISTOR DEVICE

CLAIM OF PRIORITY

This is a divisional application of U.S. application Ser. No. 12/002,728, filed Dec. 17, 2007, which claims the benefit of International Application No. PCT/JP 2006/353415, filed Dec. 27, 2006 which was not published in English under PCT Article 21(2). These applications are incorporated herein by reference in their entireties and for all purposes.

TECHNICAL FIELD

This invention relates generally to semiconductor devices and methods of manufacturing the semiconductor devices, and more particularly, to a semiconductor device that has an insulating layer between bit lines, and channel layers on side faces of the insulating layer, and to a method of manufacturing the semiconductor device.

BACKGROUND OF THE INVENTION

Recently, non-volatile memories that are data rewritable semiconductor devices have become widely used in the storage of electronic data. In flash memories that are typical of non-volatile memories, transistors forming memory cells have floating gates or insulation films that are known as charge storage layers. In such flash memories, charges are accumulated in the charge storage layers, so as to store data. Studies are still being made to produce non-volatile memories with higher storage capacity and density.

U.S. Pat. No. 6,011,725 discloses a SONOS (Silicon Oxide Nitride Oxide Silicon) flash memory that has virtual-ground memory cells, with each cell interchanging the source and drain, and operating the source and drain in a symmetrical fashion. In this flash memory, bit lines that also serve as the source and drain are formed in the semiconductor substrate, and charges can be accumulated in the trapping layer in an ONO (Oxide Nitride Oxide) film formed on the semiconductor substrate. By interchanging the source and drain, two charge storing regions can be formed in one memory cell. Accordingly, higher storage capacity and density can be achieved.

In the conventional structure disclosed in U.S. Pat. No. 6,011,725, however, the two charge storing regions overlap with each other if the distance between any of the two bit lines is made as short as 100 nm or less. Also, a substrate current flows between the bit lines on the substrate side, which is called "punchthrough." Therefore, it is difficult to shorten the distance between the bit lines, and there is a limit to the amount the storage capacity and density of each memory cell can be increased

SUMMARY OF THE INVENTION

The present invention has been made in view of the above circumstances and provides a semiconductor device and a method of manufacturing the semiconductor device by which the distance between bit lines can be shortened and higher storage capacity and density can be achieved.

According to an aspect of the present invention, there is provided a semiconductor device including: first bit lines that are provided on a substrate; an insulating layer that is provided between the first bit lines on the substrate, and has a higher upper face than the first bit lines; channel layers that are provided on both side faces of the insulating layer, and are coupled to the respective first bit lines; and charge storage layers that are provided on opposite side faces of the channel layers from the side faces on which the insulating layers are formed At least part of the channel layers is formed in a different direction from the direction of the surface of the substrate. Accordingly, the channel length can be made larger. Thus, a semiconductor device that has a shorter distance between the bit lines and can easily achieve higher storage capacity and density can be provided.

The semiconductor device may be configured so that the channel layers are coupled to each other on the insulating layer, to form one channel layer. With this structure, a continuous channel layer can be formed between the first bit lines.

The semiconductor device may further include a second bit line that is provided on the insulating layer and is coupled to the channel layers. With this structure, the channel layers can be formed between the first bit lines and the second bit line in a different direction from the direction of the surface of the substrate. Thus, the distance between the bit lines can be made even shorter.

The semiconductor device may be configured so that the substrate has a groove between the bit lines, and the insulating layer is formed in the groove. With this structure, a substrate current flowing between the first bit lines can be restrained. Thus, the distance between the bit lines can be made even shorter.

The semiconductor device may be configured so that the insulating layer has side faces oblique with respect to a surface of the substrate. With this structure, electric field concentration at angled portions of the channel layers can be prevented, and the withstand voltage can be made higher.

The semiconductor device may further include a tunnel oxide film between the channel layers and the charge storage layers. With this structure, charges accumulated in the charge storage layers can be maintained by virtue of the tunnel oxide film.

The semiconductor device may be configured so that the channel layers include polysilicon layers. With this structure, channel layers with low resistance can be easily formed. The semiconductor device may also be configured so that the charge storage layers include silicon nitride films or floating gates. With this structure, charge storage layers that easily store charges can be formed. Furthermore, the semiconductor device may be configured so that the substrate is an insulating substrate. With this structure, a substrate current is restrained, and the distance between the first bit lines can be made even shorter. Also, an inexpensive insulating substrate can be used. Moreover, the semiconductor device may further include word lines that are perpendicular to the first bit lines, an insulating film being interposed between the word lines and the charge storage layers. With this structure, charges accumulated in the charge storage layers formed with insulating films can be maintained. Also, part of the word lines can be used as the gate.

According to another aspect of the present invention, there is provided a method of manufacturing a semiconductor device, including: forming first bit lines on a substrate; forming an insulating layer between the first bit lines, the insulating layer having a higher upper face than the upper faces of the first bit lines; forming channel layers on both side faces of the insulating layer; and forming charge storage layers on opposite side faces of the channel layers from the side faces on which the insulating film is provided. According to this aspect, a method of manufacturing a semiconductor device by which the distance between the bit lines is shortened and higher storage capacity and density is easily achieved can be provided.

The method may further include forming a groove at a portion of the substrate, the portion being located between the first bit lines, wherein forming the insulating layer includes forming an insulating film in the groove. With this structure, a substrate current flowing between the first bit lines can be restrained. Thus, the distance between the bit lines can be made even shorter.

According to yet another aspect of the present invention, there is provided a method of manufacturing a semiconductor device, including: forming insulating layers by performing etching on predetermined regions of a substrate; forming a layer to be channel layers on the substrate, the layer covering the insulating layers; forming first bit lines and channel layers from the layer to be channel layers by implanting ions into portions of the layer to be channel layers, the portions being located between the insulating layers and above the insulating layers; and forming charge storage layers on opposite side faces of the channel layers from the side faces on which the insulating layers are formed. According to this aspect, the procedure for forming the first bit lines and the channel layers can be simplified.

The method may be configured so that forming the charge storage layers includes forming charge storage layers by a sidewall technique. With this structure, the charge storage layers can be formed on the side faces of the insulating layers.

As described above, the present invention can provide a semiconductor device that has a shorter distance between the bit lines and easily achieves higher storage capacity and density, and a method of manufacturing such a semiconductor device.

BRIEF DESCRIPTION OF THE DRAWINGS

FIG. 2A through FIG. 2F are cross-sectional views illustrating the procedures for manufacturing the flash memory in accordance with the first embodiment;

FIG. 4A through FIG. 4D are cross-sectional views illustrating the procedures for manufacturing the flash memory in accordance with the second embodiment;

FIG. 8A through FIG. 8E are cross-sectional views illustrating the procedures for manufacturing the flash memory in accordance with the fifth embodiment;

FIG. 10A through FIG. 10F are cross-sectional views illustrating the procedures for manufacturing the flash memory in accordance with the sixth embodiment;

DETAILED DESCRIPTION

Reference will now be made in detail to various embodiments in accordance with the invention, examples of which are illustrated in the accompanying drawings. While the invention will be described in conjunction with various embodiments, it will be understood that these various embodiments are not intended to limit the invention to these embodiments. On the contrary, the invention is intended to cover alternatives, modifications and equivalents, which may be included within the scope of the invention as construed according to the Claims. Furthermore, in the following detailed description of various embodiments in accordance with the invention, numerous specific details are set forth in order to provide a thorough understanding of the invention. However, it will be evident to one of ordinary skill in the art that the invention may be practiced without these specific details. In other instances, well known methods, procedures, components, and circuits have not been described in detail as not to unnecessarily obscure aspects of the invention.

Figure 1A:
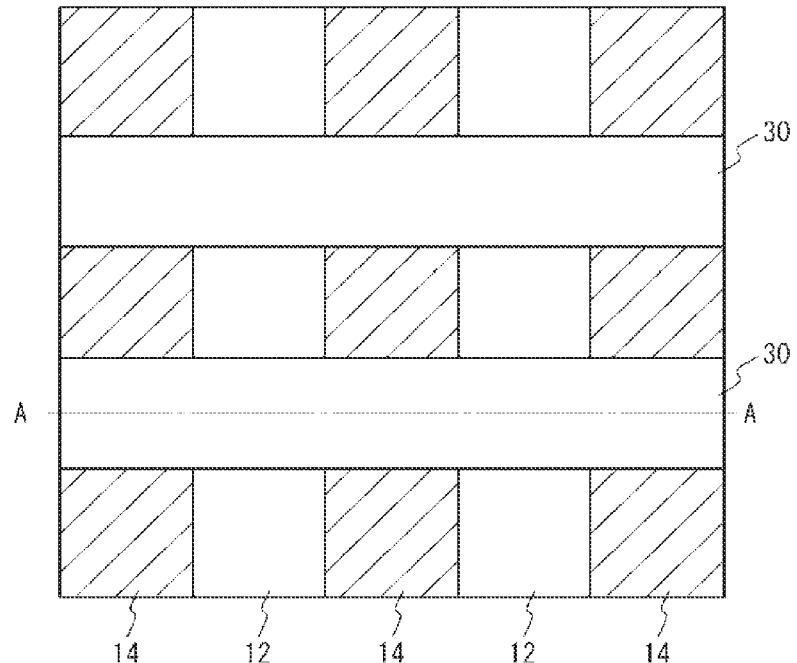
FIG. 1A is a top view of a flash memory in accordance with a first embodiment of the present invention.
Figure 1B:
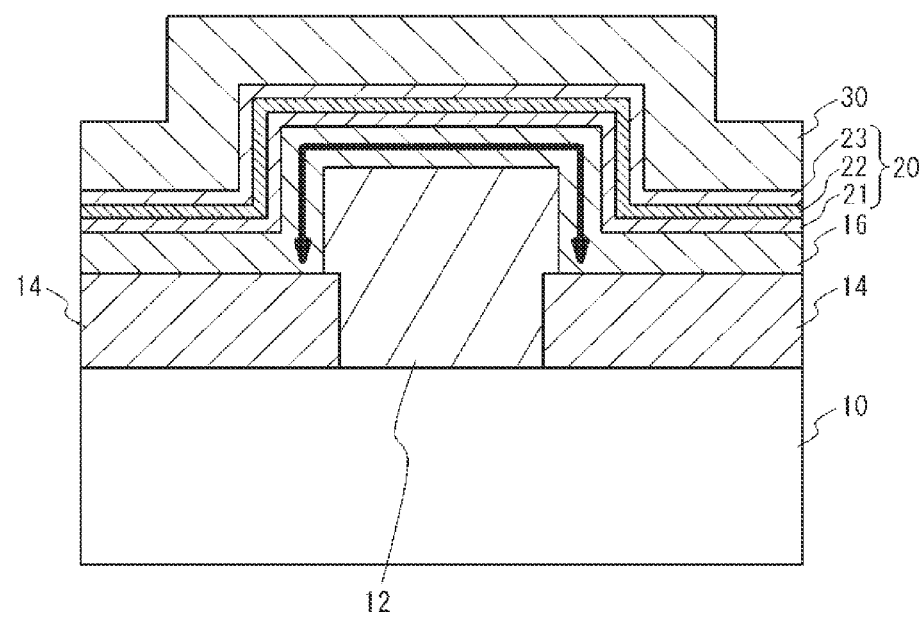
FIG. 1B is a cross-sectional view of the flash memory (only one memory cell is shown), taken along the line A-A of FIG. 1A in accordance with an embodiment of the present invention.

A first embodiment of the present invention is an example case where an ONO film is used as a charge storage layer. FIG. 1A is a top view of a flash memory (the ONO film is not shown) in accordance with the first embodiment. FIG. 1B is a cross-sectional view of the flash memory, taken along the line A-A of FIG. 1A. As shown in FIG. 1A, bit lines 14 (first bit lines) are formed, and insulating layers 12 are provided between the bit lines 14. Word lines 30 are formed over the bit lines 14 and the insulating layers 12, so as to be perpendicular to the bit lines 14.

As shown in FIG. 1B, the bit lines 14 are provided on an insulating substrate 10. The insulating layers 12 having upper faces higher than the upper faces of the bit lines 14 are provided between the bit lines 14 on the substrate 10. A pair of channel layers 16 coupled to the respective bit lines 14 are provided on both side faces of each of the insulating layers 12. Each pair of channel layers 16 are coupled to each other on each corresponding insulating layer 12, so as to form one channel layer 16. An ONO film 20 formed with a tunnel oxide film 21, a trapping layer 22 (a charge storage layer), and a top oxide film 23 is formed on the channel layer 16. In other words, the ONO film 20 is provided on the opposite side faces of the pair of channel layers 16, from the side faces on which the insulating layer 12 is provided. The word lines 30 are provided on the ONO film 20. The word lines 30 are provided so that the top oxide film 23 (an insulating film) is interposed between the word lines 30 and the trapping layer 22 (the charge storage layer). Although not shown in the drawing, an interlayer insulating film, wiring layers, a protection film and the like are provided on the word lines 30. The arrows in FIG. 1B indicates the channel length.

FIG. 2A through FIG. 2F are cross-sectional views illustrating the procedures for manufacturing the flash memory in accordance with the first embodiment. As shown in FIG. 2A, an n-type polysilicon layer 14 is formed on a substrate 10 such as a quartz substrate, a sapphire substrate, a glass substrate, or a silicon substrate, by chemical vapor deposition (CVD). As shown in FIG. 2B, openings 40 are formed in the polysilicon layer 14 on the substrate 10 by an exposure technique and an etching technique. Through this procedure, the polysilicon layer 14 is turned into bit lines 14.

The bit lines 14 are designed to have the same resistivity as the resistivity of the bit lines of a conventional flash memory. As shown in FIG. 2C, a layer 13 to be an insulating layer is formed on and between the bit lines 14. This layer 13 is formed from a silicon oxide film, for example, by CVD.

As shown in FIG. 2D, etching is performed on predetermined regions of the layer 13 by an exposure technique and an etching technique, so as to form insulating layers 12 having higher upper faces than the upper faces of the bit lines 14. The insulating layers 12 are located between the bit lines 14. As shown in FIG. 2E, a p-type polysilicon film is formed as a channel layer 16 on the bit lines 14 and on the side faces of the insulating layers 12. The channel layer 16 is designed to have the same resistivity as the resistivity of the channel layer of a conventional flash memory. As shown in FIG. 2F, a tunnel oxide film formed with a silicon oxide film, a top oxide film formed with a silicon nitride film, a trapping layer, and a silicon oxide film, are formed on the channel layer 16. Through this procedure, an ONO film 20 is formed. A polysilicon film is then formed on the ONO film 20, and word lines 30 that are perpendicular to the bit lines 14 are formed by an exposure technique and an etching technique. After that, an interlayer insulating film, wiring layers, a protection film and the like are formed to complete the flash memory in accordance with the first embodiment.

In accordance with the first embodiment, at least part of the channel layer 16 is formed to extend in a different direction from the horizontal direction of the surface of the substrate 10, as shown in FIG. 1B. Accordingly, the channel length can be made greater than the distance between each two bit lines 14, as indicated by the arrows in FIG. 1B. Also, the ONO film 20 can be made longer. With this arrangement, even in a case where the distance between each two bit lines 14 becomes as short as 100 nm or less, the two charge storing regions formed in the ONO film 20 do not overlap with each other. Thus, the size of each memory cell can be reduced. Also, since the bit lines 14 and the channel layer 16 are formed with polysilicon layers, the substrate 10 can be formed with an insulating material. In such a case, the substrate current can be restrained, and punchthrough can be prevented. Furthermore, with an inexpensive insulating substrate, the costs of production can be lowered.

Figure 3:
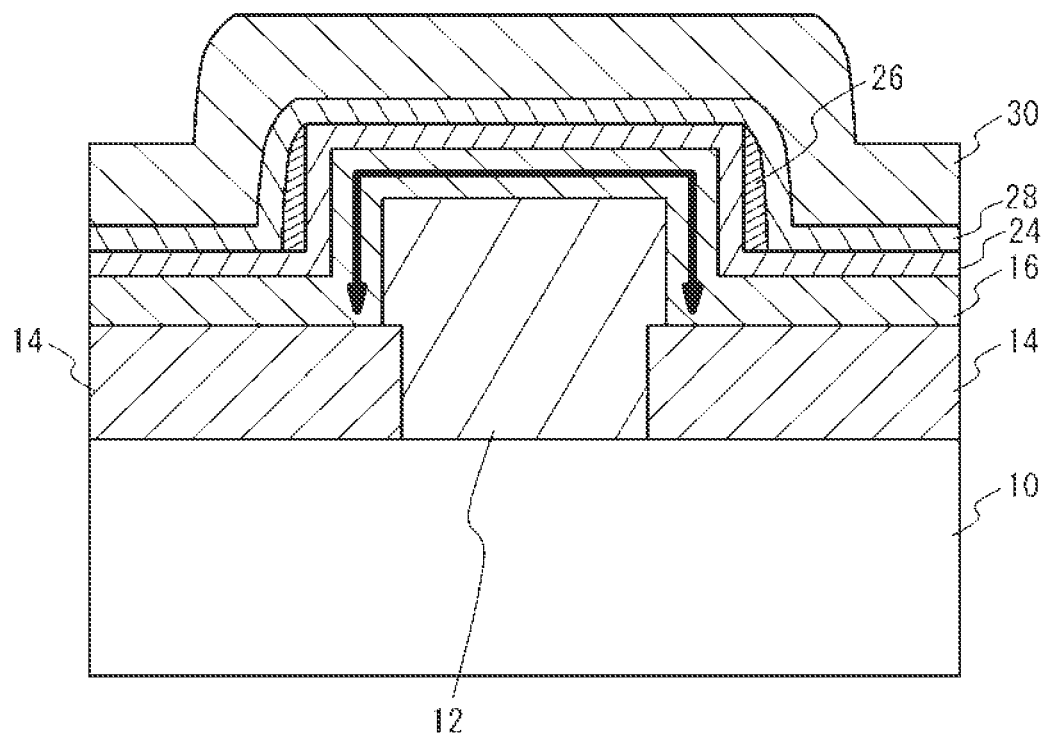
FIG. 3 is a cross-sectional view of a flash memory in accordance with a second embodiment of the present invention.

A second embodiment of the present invention is an example case where two charge storage layers are provided on both side faces of an insulating layer, so that the two charge storage layers are located physically at a distance from each other. FIG. 3 is a cross-sectional view of a flash memory in accordance with the second embodiment. A tunnel oxide film 24 is provided on a channel layer 16. Charge storage layers 26 made of polysilicon or silicon nitride are formed on the side portions of a tunnel oxide film 24. More specifically, the two charge storage layers 26 are provided on the opposite side faces of the channel layer 16 from the side faces on which an insulating layer 12 is provided. A top oxide film 28 is formed over the charge storage layers 26 and the tunnel oxide film 24. Word lines 30 are provided, so that the top oxide film 28 is interposed between the charge storage layers 26 and the word lines 30. The other aspects of this structure are the same as those of the structure of the first embodiment shown in FIG. 1B. The same components as those shown in FIG. 1B are denoted by the same reference numerals as those in FIG. 1B, and explanation of them is omitted here.

FIG. 4A through FIG. 4D are cross-sectional views illustrating the procedures for manufacturing the flash memory in accordance with the second embodiment. As shown in FIG. 4A, after the procedures of the first embodiment shown in FIG. 2A through 2E are carried out, a silicon oxide film as the tunnel oxide film 24, and a polysilicon layer 27 as a layer to be the charge storage layers, are formed on the entire surface by CVD, for example. As shown in FIG. 4B, etching is performed on the entire surface of the layer 27 to be the charge storage layers, so as to form the charge storage layers 26 on the opposite side faces of the channel layer 16 from the side faces on which the insulating layer 12 is provided. In this manner, the charge storage layers 26 can be formed by a "sidewall technique." As shown in FIG. 4C, a silicon oxide film to be the top oxide film 28 is formed over the charge storage layers 26 and the tunnel oxide film 24 by CVD, for example. As shown in FIG. 4D, a polysilicon film is formed on the top oxide film 28, and the word lines 30 that are perpendicular to the bit lines 14 are formed by an exposure technique and an etching technique. An interlayer insulating film, wiring layers, a protection film and the like are then formed, so as to complete the flash memory in accordance with the second embodiment.

As in the second embodiment, floating gates formed with polysilicon layers that are formed on side portions of the insulating layers 12 and are located physically at a distance from each other can be used as the charge storage layers 26. In the second embodiment, the channel length can be large even if the distance between each two bit lines 14 is short, as indicated by the arrows in FIG. 3. As an insulating substrate is used as the substrate 1, punchthrough can be prevented, and the size of each memory cell can be reduced. The charge storage layers 26 may be formed with insulating films such as metal layers or silicon nitride layers other than polysilicon layers.

Figure 5:
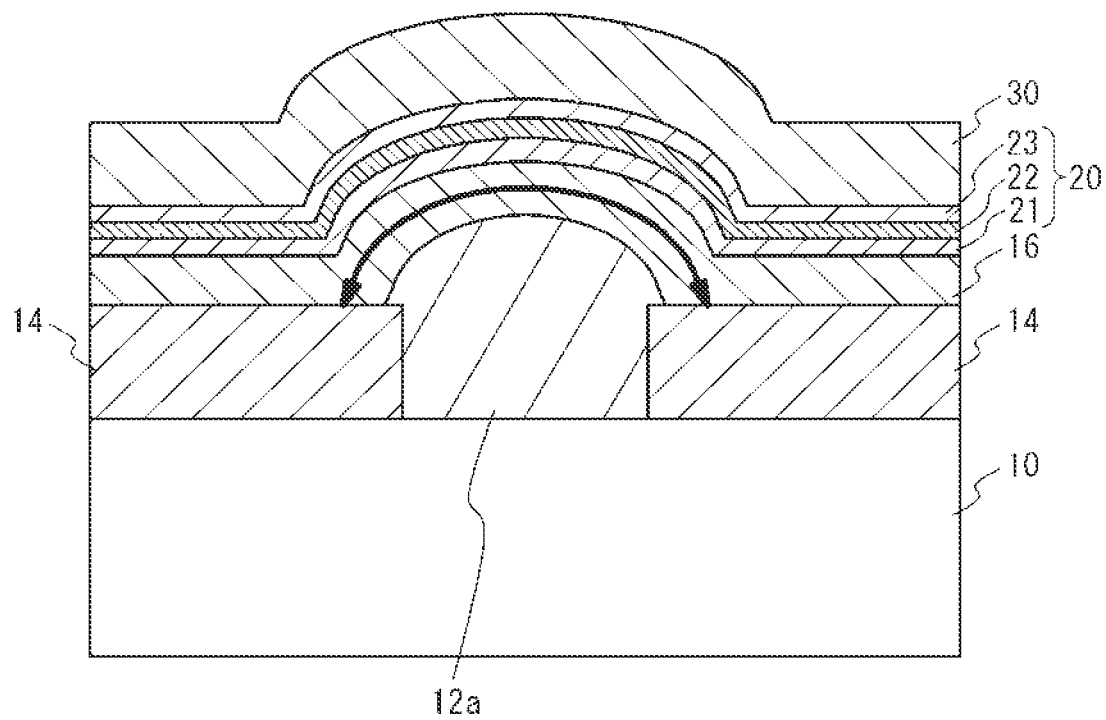
FIG. 5 is a cross-sectional view of a flash memory in accordance with a third embodiment of the present invention.

A third embodiment of the present invention is an example case where each insulating layer is designed to have oblique side faces with respect to the surface of the substrate. FIG. 5 is a cross-sectional view of a flash memory in accordance with the third embodiment. As shown in FIG. 5, the side faces of an insulating layer 12a are provided obliquely with respect to the surface of a substrate 10. The upper face of the insulating layer 12a is a curved face. Accordingly, a channel layer 16, an ONO film 20, and word lines 30 formed above the insulating layer 12a also have curved surfaces. The other aspects of this embodiment are the same as those of the structure of the first embodiment shown in FIG. 1B. The same components as those shown in FIG. 1B are denoted by the same reference numerals as those shown in FIG. 1B, and explanation of them is omitted here. In accordance with the third embodiment, the channel 16 does not have angled portions. Thus, electric field concentration onto angled portions can be restrained, and the withstand voltage can be increased.

Figure 6:
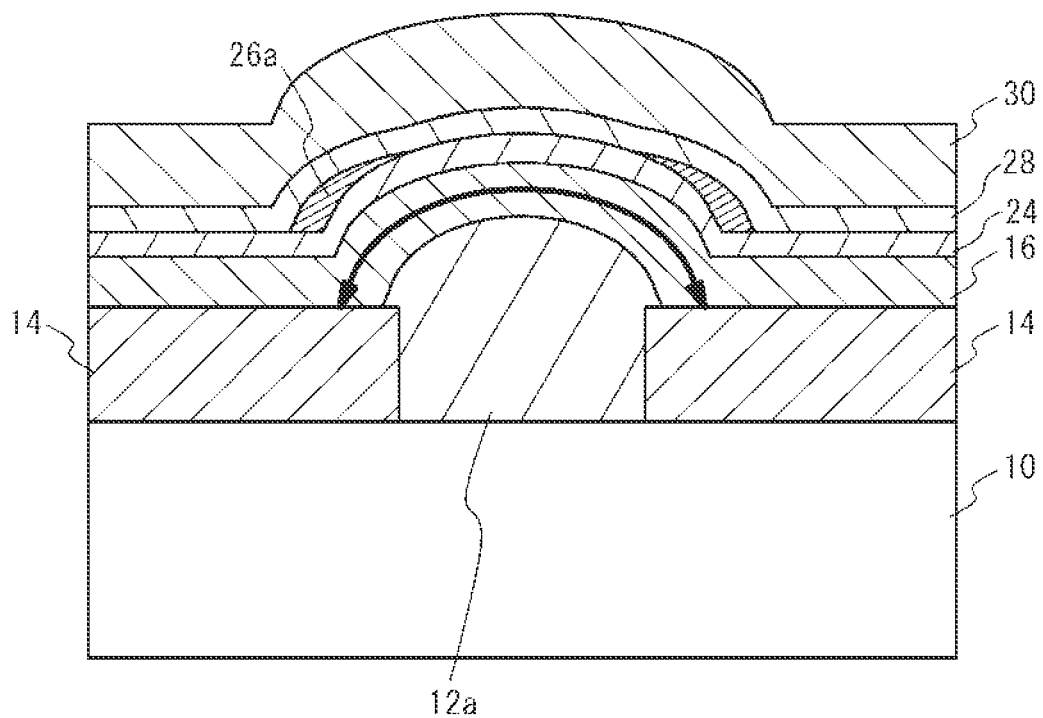
FIG. 6 is a cross-sectional view of a flash memory in accordance with a fourth embodiment of the present invention.

A fourth embodiment of the present invention is an example case where two charge storage layers are provided on both side faces of each insulating layer, and are physically separated from each other. In this example case, each insulating layer has oblique side faces with respect to the surface of the substrate. FIG. 6 is a cross-sectional view of a flash memory in accordance with the fourth embodiment. As shown in FIG. 6, two charge storage layers 26a are physically separated from each other, and the upper face of each insulating layer 12a is a curved face. A channel layer 16, a tunnel oxide film 24, the charge storage layers 26a, a top oxide film 28, and word lines 30 also have curved faces. The other aspects of this embodiment are the same as those of the structure of the second embodiment shown in FIG. 3. The same components as those shown in FIG. 3 are denoted by the same reference numerals as those shown in FIG. 3. As in the fourth embodiment, in a case where two charge storage layers as insulating layers are formed physically at a distance from each other, the channel 16 does not have angled portions. Thus, electric field concentration onto angled portions can be restrained, and the withstand voltage can be increased.

Figure 7:
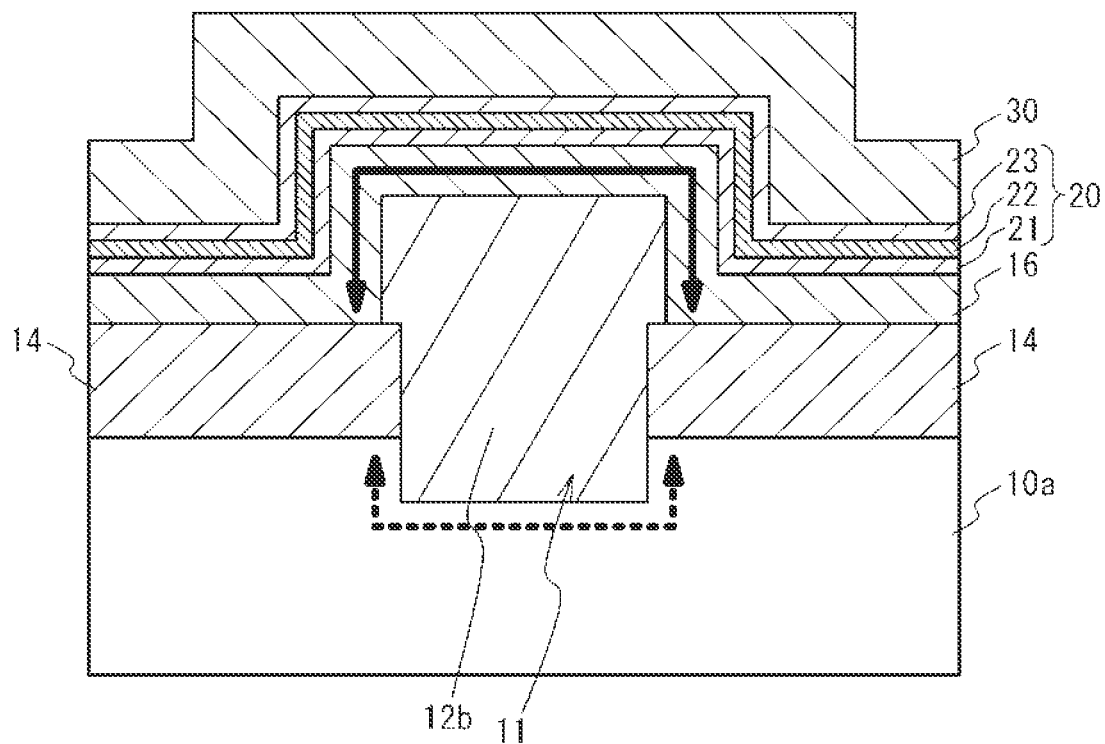
FIG. 7 is a cross-sectional view of a flash memory in accordance with a fifth embodiment of the present invention.

A fifth embodiment of the present invention is an example case where the substrate has a groove between each two bit lines, and an insulating layer is provided in each groove. FIG. 7 is a cross-sectional view of a flash memory in accordance with the fifth embodiment. Grooves 11 are formed at the portions of a substrate 10a located between bit lines 14 (first bit lines), and each of the grooves 11 is filled with an insulating layer 12b. The other aspects of this embodiment are the same as those of the structure of the first embodiment shown in FIG. 1B. The same components as those shown in FIG. 1B are denoted by the same reference numerals as those shown in FIG. 1B.

FIG. 8A through FIG. 8E are cross-sectional views illustrating the procedures for manufacturing the flash memory in accordance with the fifth embodiment. As shown in FIG. 8A, an n-type polysilicon layer is formed on the substrate 10a such as a silicon substrate by CVD. As shown in FIG. 8B, openings are formed in the polysilicon layer by an exposure technique and an etching technique. Through this procedure, the bit lines 14 are formed. If a silicon substrate is used as the substrate 10a, the bit lines 14 may be formed by implanting arsenic ions. Etching is then performed on the substrate 10a, so as to form the grooves 11. In this manner, the grooves 11 are formed at the portions of the substrate 10a located between the bit lines 14. As shown in FIG. 8C, each of the grooves 11 is filled so as to form a layer (an insulating film) to be an insulating layer on and between the bit lines 14. As shown in FIG. 8D, etching is performed on predetermined portions of the layer 13 by an exposure technique and an etching technique. Through this procedure, each of the insulating layers 12b that have higher upper faces than the upper faces of the bit lines 14 and which fill the grooves 11 are formed between the bit lines 14. As shown in FIG. 8E, the same procedures as the procedures of the first embodiment shown in FIG. 2E and FIG. 2F are carried out, so as to complete the flash memory in accordance with the fifth embodiment.

In the fifth embodiment, the insulating layers 12b are buried at the portions of the substrate 10a located between the bit lines 14. Accordingly, even if the distance between each two bit lines 14 is short, the path of a substrate current (indicated by the dotted arrows in FIG. 7) flowing in the substrate 10a can be lengthened between each two bit lines 14. With this arrangement, the substrate current can be restrained with higher efficiency than in a case where the grooves 11 are not formed. Thus, punchthrough can be prevented, and the size of each memory cell can be reduced. The fifth embodiment is particularly effective in cases where a semiconductor substrate such as a silicon substrate in which a substrate current easily flows is used as the substrate 10a. However, an insulating substrate may be employed as the substrate 10a. The structure having the grooves 11 that are formed in the substrate 10a and are filled with the insulating layers 12b may be employed in any of the second through fourth embodiments.

Figure 9A:
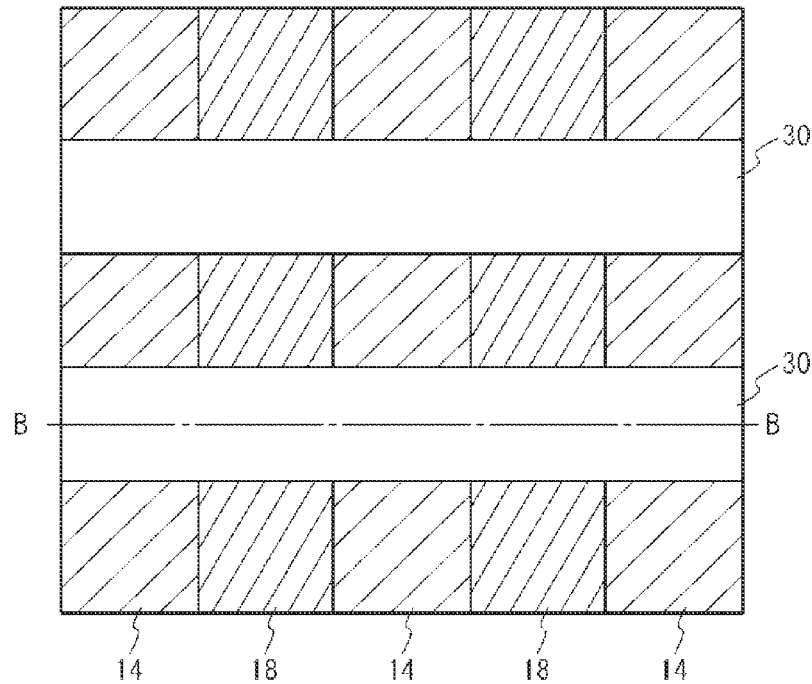
FIG. 9A is a top view of a flash memory in accordance with a sixth embodiment of the present invention.
Figure 9B:
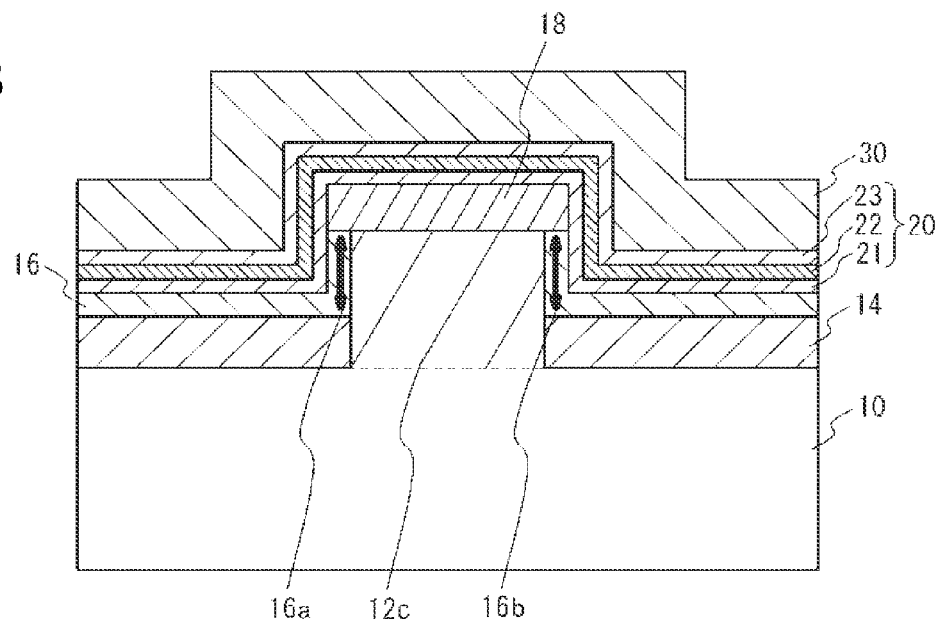
FIG. 9B is a cross-sectional view of the flash memory (only one memory cell is shown), taken along the line B-B of FIG. 9A in accordance with an embodiment of the present invention.

A sixth embodiment of the present invention is an example case where a pair of channel layers are provided on the side faces of each insulating layer, and a second bit line coupled to the pair of channel layers is provided on the insulating layer. FIG. 9A is a top view of a flash memory in accordance with the sixth embodiment (the ONO film is not shown). FIG. 9B is a cross-sectional view of the flash memory, taken along the line B-B of FIG. 9A. As shown in FIG. 9A, first bit lines 14 are arranged at intervals, and second bit lines 18 are provided between the first bit lines 14. Word lines 30 that are perpendicular to the first bit lines 14 and the second bit lines 18 are provided above the first bit lines 14 and the second bit lines 18.

As shown in FIG. 9B, a pair of bit lines 14 are provided on an insulating substrate 10. An insulating layer 12c having a higher upper face than the upper faces of the bit lines 14 is provided between the bit lines 14 on the substrate 10. A pair of channel layers 16a and 16b coupled to the respective bit lines 14 are provided on both side faces of the insulating layer 12c. A second bit line 18 coupled to the channel layers 16a and 16b is provided on the insulating layer 12c. An ONO film 20 formed with a tunnel oxide film 21, a trapping layer 22 (a charge storage layer), and a top oxide film 23 is formed on the first bit lines 14 and the second bit line 18 and at the side portions of the channel layers 16a and 16b. Here, the ONO film 20 is provided on the opposite side faces of the channel layers 16 from the side faces on which the insulating layer 12c is provided. Word lines 30 are formed on the ONO film 20, so that the top oxide film 23 (an insulating film) is interposed between the word lines 30 and the trapping layer 22 (a charge storage layer). Although not shown in the drawing, an interlayer insulating film, wiring layers, a protection film, and the likes are formed on the word line 30. The arrows in FIG. 9B indicate the channel length.

FIG. 10A through FIG. 10F are cross-sectional views illustrating the procedures for manufacturing the flash memory in accordance with the sixth embodiment. As shown in FIG. 10A, the substrate 10 such as a quartz substrate, a sapphire substrate, a glass substrate, or a silicon substrate is prepared. As shown in FIG. 10B, etching is performed on predetermined regions of the substrate 10 by an exposure technique and an etching technique, so as to form the insulating layers 12c each having a protruding form on the substrate 10. Although the insulating layers 12c are made of the same material as the substrate 10, the insulating layers 12c are indicated by hatched lines in FIG. 10B through 10F. As shown in FIG. 10C, a layer 17 to be channel layers is formed on the substrate 10 with an n-type polysilicon layer having boron added thereto. The layer 17 covers the insulating layers 12.

As shown in FIG. 10D, arsenic ions are vertically injected into the portions of the layer 17 to be the channel layers located on and between the insulating layers 12c. The portions of the layer 17 to be the channel layers that have the arsenic ions injected thereto are turned into the first bit lines 14 and the second bit lines 18. Since the ion implantation is performed in the vertical direction, the portions of the layer 17 to be the channel layers that are located on the side faces of the insulating films 12c and do not have arsenic ions injected thereto are turned into the channel layers 16. In this manner, the first bit lines 14, the second bit lines 18, and the channel layers 16 are formed. As shown in FIG. 10E, the ONO film 20 formed with a tunnel oxide film that is a silicon oxide film, a trapping layer (a charge storage layer) that is a silicon nitride film, and a top oxide film that is also a silicon oxide film, is formed on the first bit lines 14 and the second bit lines 18 and at the side portions of the channel layers 16. In this manner, the ONO film 20 including the trapping layer 22 is formed on the opposite side faces of the channel layers 16 from the side faces on which the insulating films 12c are provided. As shown in FIG. 10F, a polysilicon film is formed on the ONO film 20, and the word lines 30 that are perpendicular to the bit lines 14 are formed by an exposure technique and an etching technique. After that, an interlayer insulating film, wiring layers, a protection film and the like are formed, so as to complete the flash memory in accordance with the sixth embodiment.

In accordance with the sixth embodiment, the first bit lines 14 are adjacent to the second bit lines 18, as shown in FIG. 9A. Also, the channel layers 16 are formed in the vertical direction, as indicated by the arrows in FIG. 9B. Accordingly, the distance between each two bit lines is shorter, and smaller memory cells can be produced. If each insulating layer 12c is made taller so as to have a channel length of 100 nm or more, two charge storing regions can be formed at the portions of the ONO film 20 between the first bit lines 14 and the second bit line 18. Thus, two bits can be stored in one memory cell. Alternatively, only one charge storing region may be formed at the portions of the ONO film 20 between the first bit lines 14 and the second bit line 18. In that case, one bit is stored in each one memory cell, and the channel length can be made smaller or the insulating layer 12c can be made shorter. Thus, the manufacturing becomes easier.

Also, as shown in FIG. 10D, the first bit lines 14, the second bit lines 18, and the channel layers 16 are formed from the layer 17 to be channel layers. Thus, the procedures for forming the first bit lines 14 and the second bit lines 18 can be simplified.

Figure 11:
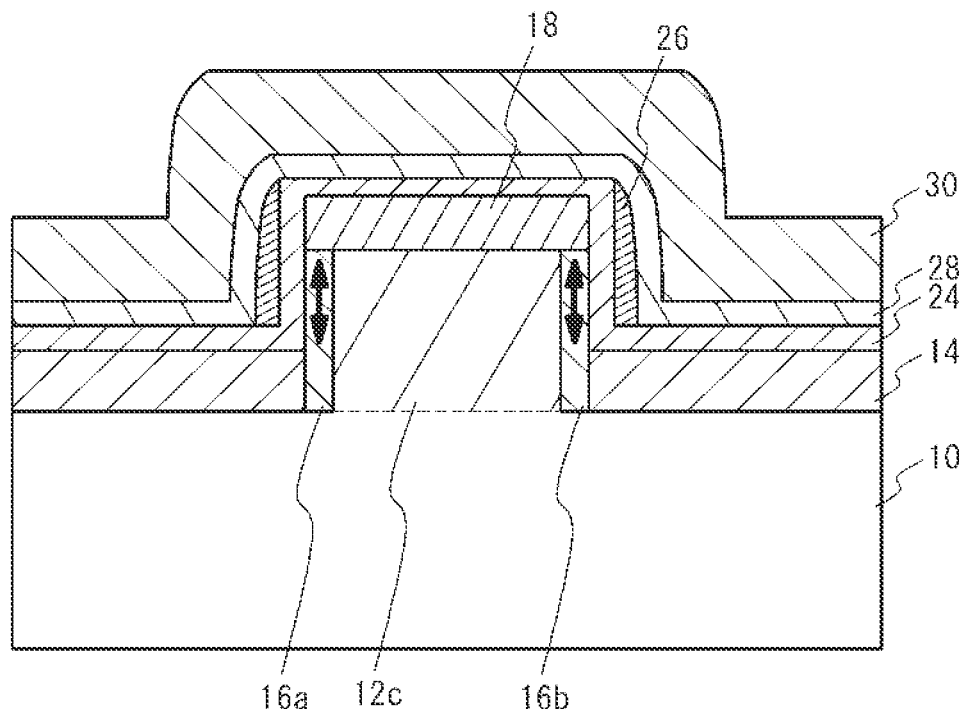
FIG. 11 is a cross-sectional view of a flash memory in accordance with a seventh embodiment of the present invention.

A seventh embodiment of the present invention is an example case where two charge storage layers are provided on both sides of each insulating layer, and are physically separated from each other. FIG. 11 is a cross-sectional view of a flash memory in accordance with the seventh embodiment. As shown in FIG. 11, a tunnel oxide film 24 is provided at the side portions of channel layers 16a and 16 and on first bit lines 14 and a second bit line 18. Charge storage layers 26 made of polysilicon or silicon nitride are formed at the side portions of the tunnel oxide film 24. Here, the two charge storage layers 26 are provided on the opposite side faces of the channel layers 16 from the side faces on which an insulating layer 12c is provided. A top oxide film 28 is provided over the charge storage layers 26 and the top oxide film 24. Word lines 30 are provided, so that the top oxide film 28 is interposed between the word lines 30 and the charge storage layers 26. The other aspects of this structure are the same as those of the sixth embodiment shown in FIG. 9B. The same components as those shown in FIG. 9B are denoted by the same reference numerals as those in FIG. 9B, and explanation of them is omitted here.

Figure 12A:
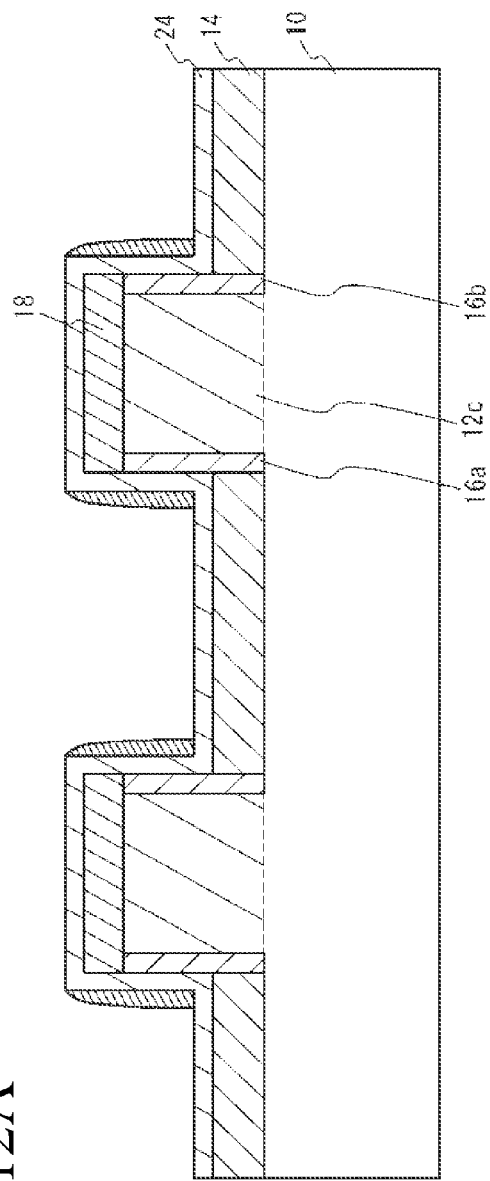
FIG. 12A and FIG. 12B are cross-sectional views illustrating the procedures for manufacturing the flash memory in accordance with the seventh embodiment
Figure 12B:
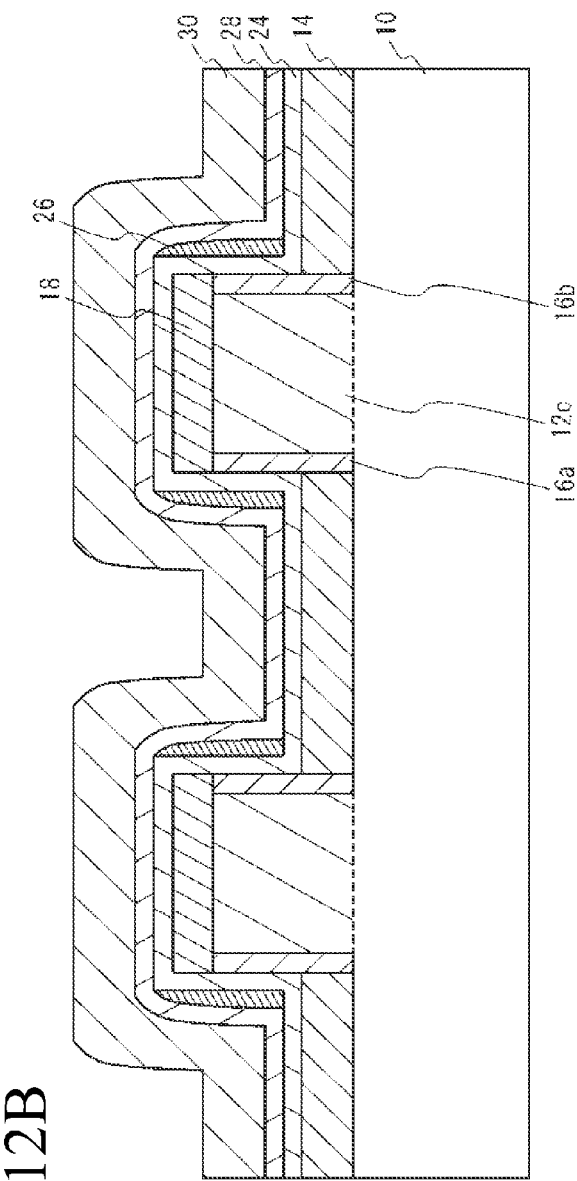

FIG. 12A and FIG. 12B are cross-sectional views illustrating the procedures for manufacturing the flash memory in accordance with the seventh embodiment. As shown in FIG. 12A, after the same procedures as the procedures of the sixth embodiment shown in FIG. 10A through FIG. 10E are carried out, the charge storage layers 26 are formed on the opposite side faces of the channel layers 16a and 16b from the side faces on which the insulating layers 12c are provided by a "sidewall technique." As shown in FIG. 12B, a top oxide film 28 is formed over the charge storage layers 26 and the tunnel oxide film 24 by CVD, for example. A polysilicon film is then formed on the top oxide film 28, and the word lines 30 that are perpendicular to the bit lines 14 are formed by an exposure technique and an etching technique. After that, an interlayer insulating film, wiring layers, a protection film, and the likes are formed, so as to complete the flash memory in accordance with the seventh embodiment.

As in the seventh embodiment, floating gates formed with polysilicon layers physically separated from each other can be used as the charge storage layers 26 formed at side portions of the channel layers 16a and 16b. As the channel layers 16 are also provided in the vertical direction in the seventh embodiment, the distance between each two bit lines can be made shorter, and smaller memory cells can be produced. The charge storage layers 26 may be formed with insulating films other than polysilicon layers, such as metal layers or silicon nitride layers.

Figure 13:
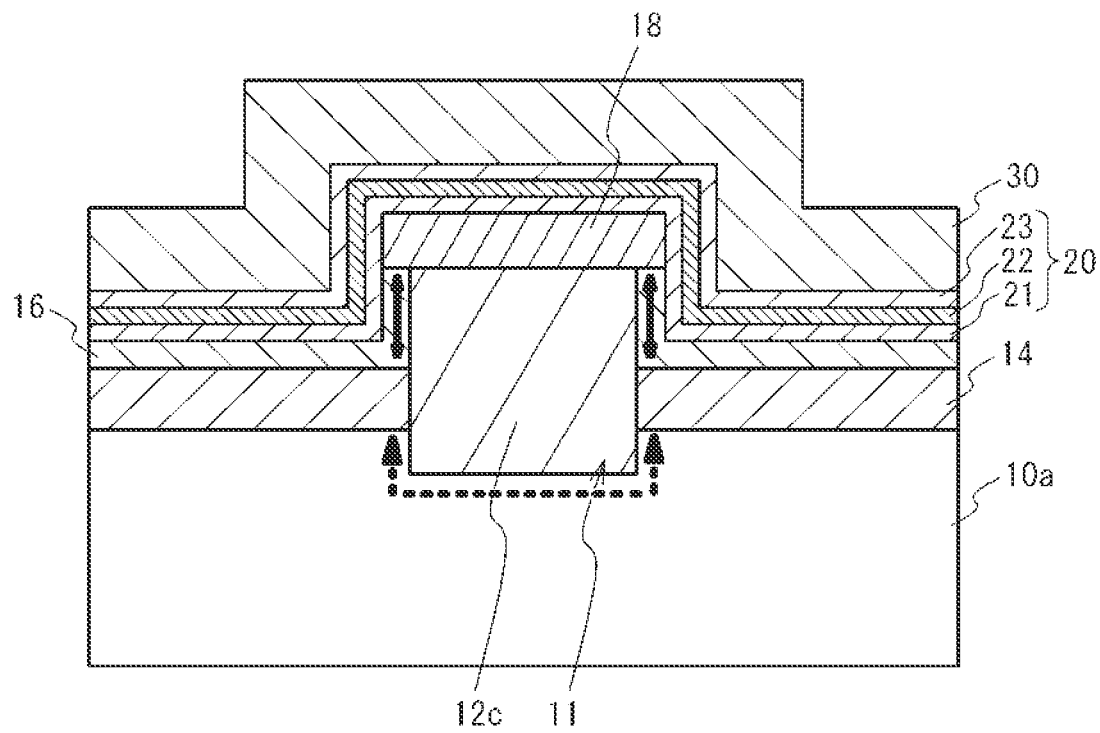
FIG. 13 is a cross-sectional view of a flash memory in accordance with an eighth embodiment of the present invention.

An eighth embodiment of the present invention is an example case where the substrate has a groove between first bit lines, and an insulating layer is formed in the groove. FIG. 13 is a cross-sectional view of a flash memory in accordance with the eighth embodiment. A groove 11 is formed at the portion of a substrate 10a located between bit lines 14, and the groove 11 is filled with an insulating layer 12d. The other aspects of this structure are the same as those of the sixth embodiment shown in FIG. 9B. The same components as those shown in FIG. 9B are denoted by the same reference numerals as those in FIG. 9B, and explanation of them is omitted herein.

In the eighth embodiment, the insulating layer 12d is buried at the portion of the substrate 10a located between the bit lines 14. Accordingly, even if the distance between the bit lines 14 is made smaller, the path of a substrate current (indicated by the dotted arrows in FIG. 13) flowing in the substrate 10a can be lengthened between the bit lines 14, and the substrate current can be restrained. Thus, punchthrough can be prevented, and the size of each memory cell can be reduced. The eighth embodiment is particularly effective in cases where a semiconductor substrate such as a silicon substrate in which a substrate current easily flows is used as the substrate 10a. However, an insulating substrate may be employed as the substrate 10a. The structure having the groove 11 that is formed in the substrate 10a and is filled with the insulating layer 12b may also be employed in the seventh embodiment. The insulating layer having oblique side faces of the third embodiment or the fourth embodiment may also be employed in any of the structures of the sixth through eighth embodiments.

In the first through eighth embodiments, polysilicon layers are used for the channel layers 16, the first bit lines 14, and the second bit lines 18. Since low-resistance layers can be easily formed with polysilicon layers, polysilicon layers are desirable as the channel layers 16, the first bit lines 14, and the second bit lines 18. However, the channel layers 16, the first bit lines 14, and the second bit lines 18 are not limited to polysilicon layers, but may be formed with any other conductive layers, as long as they can formed on the insulating layers 12. Although the insulating layers 12 are formed with silicon oxide layers in the above described embodiments, insulating layers such as silicon nitride layers may be employed as the insulating layers 12.

Figure 14:
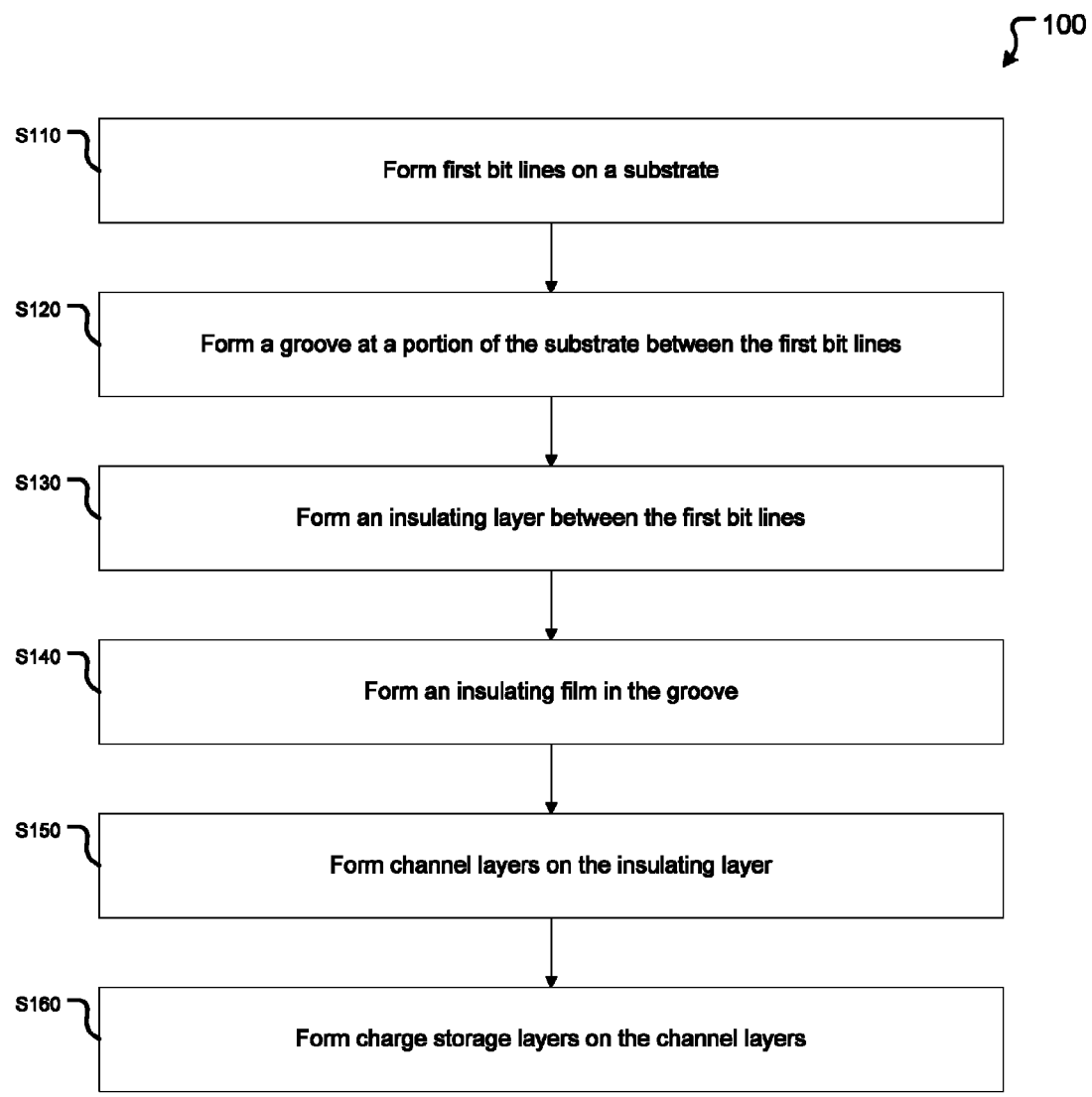
FIG. 14 illustrates a flowchart for a process of manufacturing the flash memory in accordance with an embodiment of the present invention.

FIG. 14 illustrates a flowchart 100 for a process of manufacturing the flash memory in accordance with an embodiment of the present invention. At block 110, first bit lines 14 are formed on a substrate 10. At block 120, grooves 11 are formed at a portion of the substrate 10 located between the first bit lines 14. At block 130, an insulating layer 12 is formed between the first bit lines 14 with an upper face that is higher than the upper faces of the first bit lines 14. At block 140, an insulating film is formed in the grooves 11. At block 150, channels layers 16 are formed on the insulating layer 12. Charge storage layers 22 are then formed on the channel layers 16 (block 160).

Figure 15:
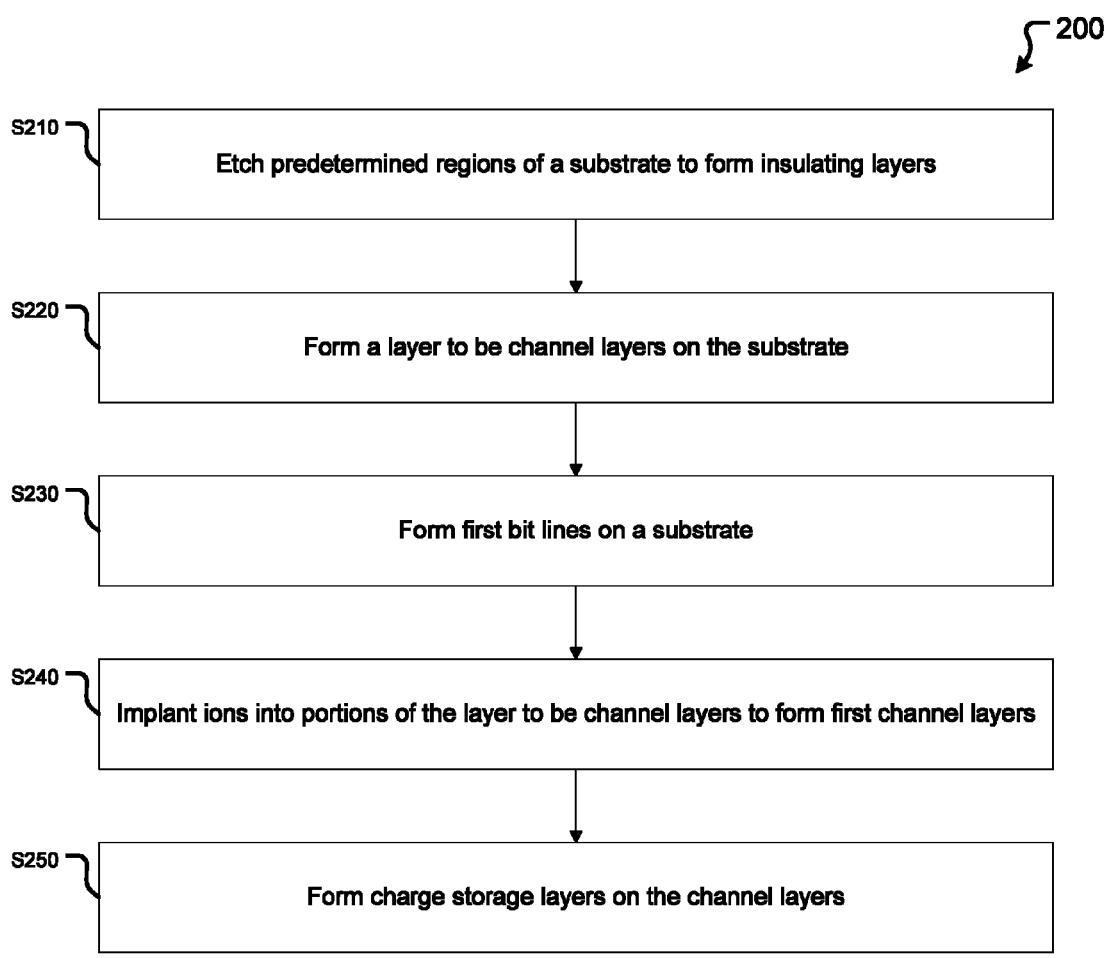
FIG. 15 illustrates a flowchart for a process of manufacturing the flash memory without a grooved portion of the substrate, in accordance with an embodiment of the present invention.

FIG. 15 illustrates a flowchart 200 for a process of manufacturing the flash memory without a grooved portion of the substrate 10, in accordance with an embodiment of the present invention. At block 210 insulating layers 12 are formed by etching predetermined regions of the substrate 10. At block 220 a layer 17 to be the channel layer 16, which covers the insulating layer 12, is formed on the substrate 10. At block 230 bit lines 14 are formed on the substrate 10. At block 240 ions are implanted into portions of the layer 17 to be channel layers 16, with the portions being located above and between the insulating layers 12, to form a channel layer 16. Charge storage layers 22 are then formed on the channel layers 16 at block 150.

Embodiments generally relate to semiconductor devices. More particularly, embodiments allow for a semiconductor device with a shorter distance between the bit lines and higher storage capacity and density than those conventionally known. In one implementation, the various embodiments are applicable to flash memory and devices that utilize flash memory. Flash memory is a form of non-volatile memory that can be electrically erased and reprogrammed As such, flash memory, in general, is a type of electrically erasable programmable read only memory (EEPROM).

Like Electrically Erasable Programmable Read Only Memory (EEPROM), flash memory is nonvolatile and thus can maintain its contents even without power. However, flash memory is not standard EEPROM. Standard EEPROMs are differentiated from flash memory because they can be erased and reprogrammed on an individual byte or word basis while flash memory can be programmed on a byte or word basis, but is generally erased on a block basis. Although standard EEPROMs may appear to be more versatile, their functionality requires two transistors to hold one bit of data. In contrast, flash memory requires only one transistor to hold one bit of data, which results in a lower cost per bit. As flash memory costs far less than EEPROM, it has become the dominant technology wherever a significant amount of non-volatile, solid-state storage is needed.

Exemplary applications of flash memory include digital audio players, digital cameras, digital video recorders, and mobile phones. Flash memory is also used in USB flash drives, which are used for general storage and transfer of data between computers. Also, flash memory is gaining popularity in the gaming market, where low-cost fast-loading memory in the order of a few hundred megabytes is required, such as in game cartridges. Additionally, flash memory is applicable to cellular handsets, smartphones, personal digital assistants, set-top boxes, digital video recorders, networking and telecommunication equipments, printers, computer peripherals, automotive navigation devices, and gaming systems.

As flash memory is a type of non-volatile memory, it does not need power to maintain the information stored in the chip. In addition, flash memory offers fast read access times and better shock resistance than traditional hard disks. These characteristics explain the popularity of flash memory for applications such as storage on battery-powered devices (e.g., cellular phones, mobile phones, IP phones, wireless phones, etc.).

Flash memory stores information in an array of floating gate transistors, called "cells," each of which traditionally stores one bit of information. However, newer flash memory devices can store more than 1 bit per cell. These newer flash memory devices double the intrinsic density of a Flash memory array by storing two physically distinct bits on opposite sides of a memory cell. Each bit serves as a binary bit of data (e.g., either 1 or 0) that is mapped directly to the memory array. Reading or programming one side of a memory cell occurs independently of whatever data is stored on the opposite side of the cell.

With regards to wireless markets, the newer flash memory devices have several key advantages, such as being capable of burst-mode access as fast as 80 MHz, page access times as fast as 25 ns, simultaneous read-write operation for combined code and data storage, and low standby power (e.g., 1 µA).

Figure 16:
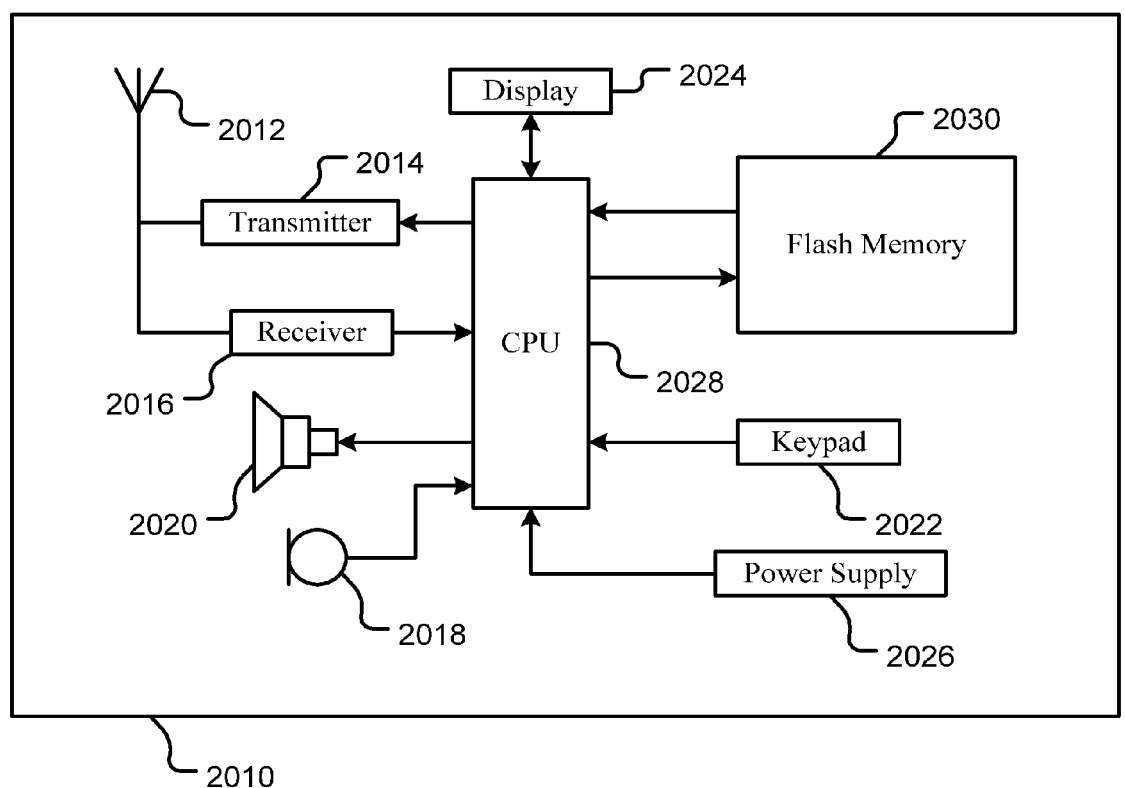
FIG. 16 illustrates a block diagram of an exemplary portable phone, upon which various embodiments of the invention may be implemented.

FIG. 16 shows a block diagram of an exemplary portable telephone 2010 (e.g., cell phone, cellular phone, mobile phone, internet protocol phone, wireless phone, etc.), upon which various embodiments of the invention can be implemented. The cell phone 2010 includes an antenna 2012 coupled to a transmitter 2014 and a receiver 2016, as well as a microphone 2018, a speaker 2020, a keypad 2022, and a display 2024. The cell phone 2010 also includes a power supply 2026 and a central processing unit (CPU) 2028, which may be an embedded controller, conventional microprocessor, or the like. In addition, the cell phone 2010 includes integrated, flash memory 2030. Flash memory 2030 can include a nonvolatile memory device with a shorter distance between the bit lines and higher storage capacity and density than those conventionally known. In various embodiments, the flash memory 2030 can be utilized with various devices, such as mobile phones, cellular phones, internet protocol phones, and/or wireless phones.

Flash memory comes in two primary varieties, NOR-type flash and NAND-type flash. While the general memory storage transistor is the same for all flash memory, it is the interconnection of the memory cells that differentiates the designs. In a conventional NOR-type flash memory, the memory cell transistors are coupled to the bit lines in a parallel configuration, while in a conventional NAND-type flash memory, the memory cell transistors are coupled to the bit lines in series. For this reason, NOR-type flash is sometimes referred to as "parallel flash" and NAND-type flash is referred to as "serial flash."

Traditionally, portable phone (e.g., cell phone) CPUs have needed only a small amount of integrated NOR-type flash memory to operate. However, as portable phones (e.g., cell phone) have become more complex, offering more features and more services (e.g., voice service, text messaging, camera, ring tones, email, multimedia, mobile TV, MP3, location, productivity software, multiplayer games, calendar, and maps.), flash memory requirements have steadily increased. Thus, an improved flash memory will render a portable phone more competitive in the telecommunications market.

Also, as mentioned above, flash memory is applicable to a variety of devices other than portable phones. For instance, flash memory can be utilized in personal digital assistants, set-top boxes, digital video recorders, networking and telecommunication equipments, printers, computer peripherals, automotive navigation devices, and gaming systems.

It is noted that the components (e.g., 2012, 2014, 2016, 2022, 2028, 2030, etc.) of portable telephone 2010 can be coupled to each other in a wide variety of ways. For example, in an embodiment, the antenna 2012 can be coupled to transmitter 2014 and receiver 2016. Additionally, the transmitter 2014, receiver 2016, speaker 2020, microphone 2018, power supply 2026, keypad 2022, flash memory 2030 and display 2024 can each be coupled to the processor (CPU) 2028. It is pointed out that in various embodiments, the components of portable telephone 2010 can be coupled to each other via, but are not limited to, one or more communication buses, one or more data buses, one or more wireless communication technologies, one or more wired communication technologies, or any combination thereof.

Figure 17:
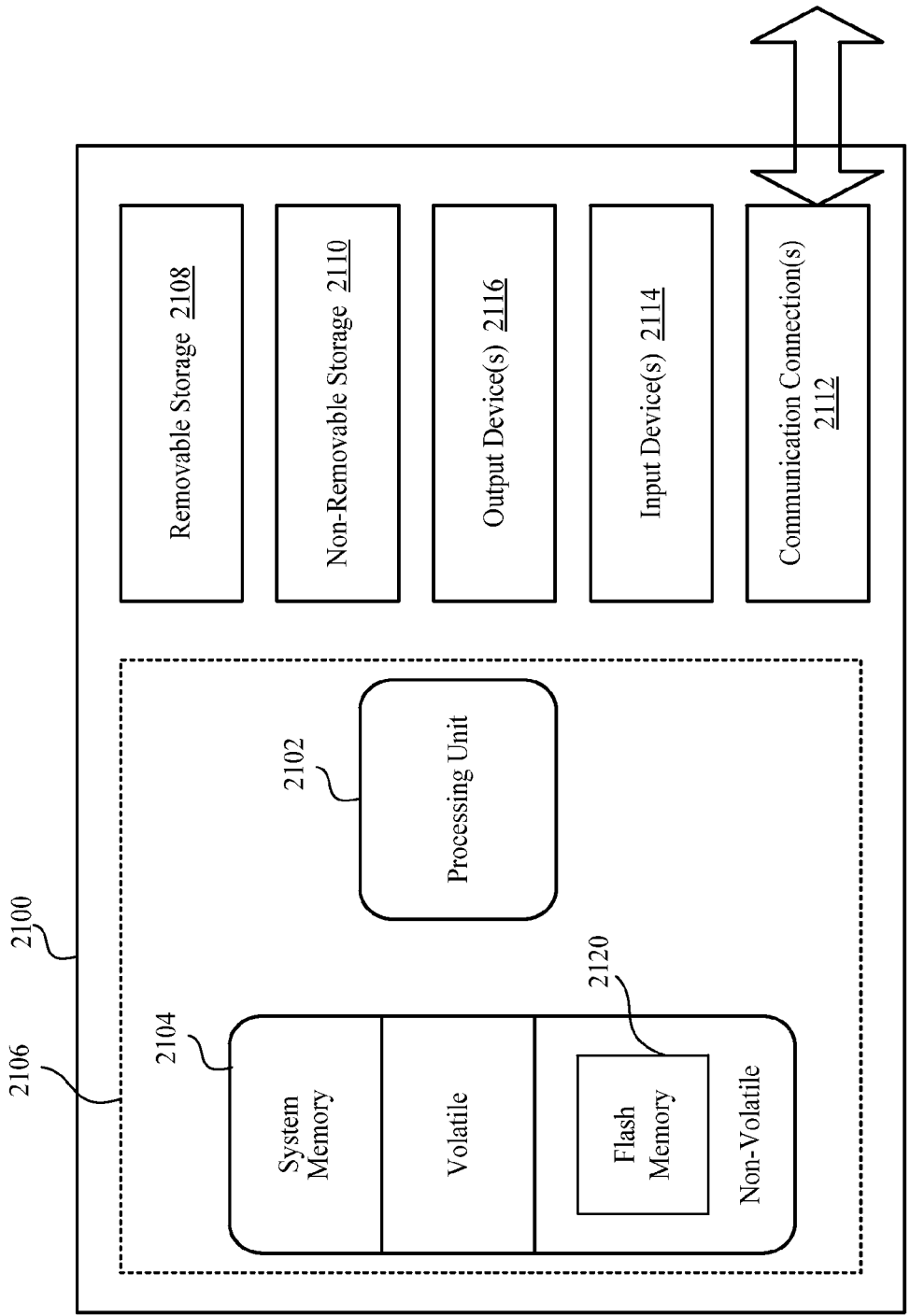
FIG. 17 illustrates a block diagram of an exemplary computing device, upon which various embodiments of the invention may be implemented.

FIG. 17 illustrates a block diagram of an exemplary computing device 2100, upon which various embodiments of the invention can be implemented. Although computing device 2100 is shown and described in FIG. 17 as having certain numbers and types of elements, the embodiments are not necessarily limited to the exemplary implementation. That is, computing device 2100 can include elements other than those shown, and can include more than one of the elements that are shown. For example, computing device 2100 can include a greater number of processing units than the one (processing unit 2102) shown. In an embodiment, computing device 2100 can include additional components not shown in FIG. 17.

Also, it is appreciated that the computing device 2100 can be a variety of things. For example, computing device 2100 may be, but is not limited to, a personal desktop computer, a portable notebook computer, a personal digital assistant (PDA), and a gaming system. Flash memory is especially useful with small-form-factor computing devices such as PDAs and portable gaming devices. Flash memory offers several advantages. In one example, flash memory is able to offer fast read access times while at the same time being able to withstand shocks and bumps better than standard hard disks. This is important as small computing devices are often moved around and encounter frequent physical impacts. Also, flash memory is more able than other types of memory to withstand intense physical pressure and/or heat. Thus, portable computing devices are able to be used in a greater range of environmental variables.

Computing device 2100 can include at least one processing unit 2102 and memory 2104. Depending on the exact configuration and type of computing device, memory 2104 may be volatile (such as RAM), non-volatile (such as ROM, flash memory, etc.) or some combination of the two. This most basic configuration of computing device 2100 is illustrated in FIG. 17 by line 2106. Additionally, device 2100 may also have additional features/functionality. For example, device 2100 may also include additional storage (removable and/or non-removable) including, but not limited to, magnetic or optical disks or tape. In one example, in the context of a gaming system, the removable storage could be a game cartridge receiving component utilized to receive different game cartridges. In another example, in the context of a Digital Versatile Disc (DVD) recorder, the removable storage is a DVD receiving component utilized to receive and read DVDs. Such additional storage is illustrated in FIG. 17 by removable storage 2108 and non-removable storage 2110. Computer storage media includes volatile and nonvolatile, removable and non-removable media implemented in any method or technology for storage of information such as computer readable instructions, data structures, program modules or other data. Memory 2104, removable storage 2108 and non-removable storage 2110 are all examples of computer storage media. Computer storage media includes, but is not limited to, RAM, ROM, EEPROM, flash memory 2120 or other memory technology, CD-ROM, digital video disks (DVD) or other optical storage, magnetic cassettes, magnetic tape, magnetic disk storage or other magnetic storage devices, or any other medium which can be used to store the desired information and which can accessed by device 2100. Any such computer storage media may be part of device 2100.

In the present embodiment, Flash memory 2120 can include a memory device with a shorter distance between the bit lines and higher storage capacity and density than those conventionally known. In various embodiments, the flash memory 2120 can be utilized with various devices, such as personal digital assistants, set-top boxes, digital video recorders, networking and telecommunication equipments, printers, computer peripherals, automotive navigation devices, gaming systems, mobile phones, cellular phones, internet protocol phones, and/or wireless phones. Further, in one embodiment, the flash memory 2120 utilizes newer flash memory technology to allow storing of two physically distinct bits on opposite sides of a memory cell.

Device 2100 may also contain communications connection(s) or coupling(s) 2112 that allow the device to communicate with other devices. Communications connection(s) 2112 is an example of communication media. Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection or coupling, and wireless media such as acoustic, radio frequency (RF), infrared and other wireless media. The term computer readable media as used herein includes both storage media and communication media.

It is noted that the components (e.g., 2102, 2104, 2110, 2120, etc.) of computing device 2100 can be coupled to each other in a wide variety of ways. For example in various embodiments, the components of computing device 2100 can be coupled to each other via, but are not limited to, one or more communication buses, one or more data buses, one or more wireless communication technologies, one or more wired communication technologies, or any combination thereof.

Device 2100 may also have input device(s) 2114 such as keyboard, mouse, pen, voice input device, game input device (e.g., a joy stick, a game control pad, and/or other types of game input device), touch input device, etc. Output device(s) 2116 such as a display (e.g., a computer monitor and/or a projection system), speakers, printer, network peripherals, etc., may also be included. All these devices are well known in the art and need not be discussed at length here.

Aside from mobile phones and portable computing devices, flash memory is also widely used in portable multimedia devices, such as portable music players. As users would desire a portable multimedia device to have as large a storage capacity as possible, an increase in memory density would be advantageous.

Figure 18:
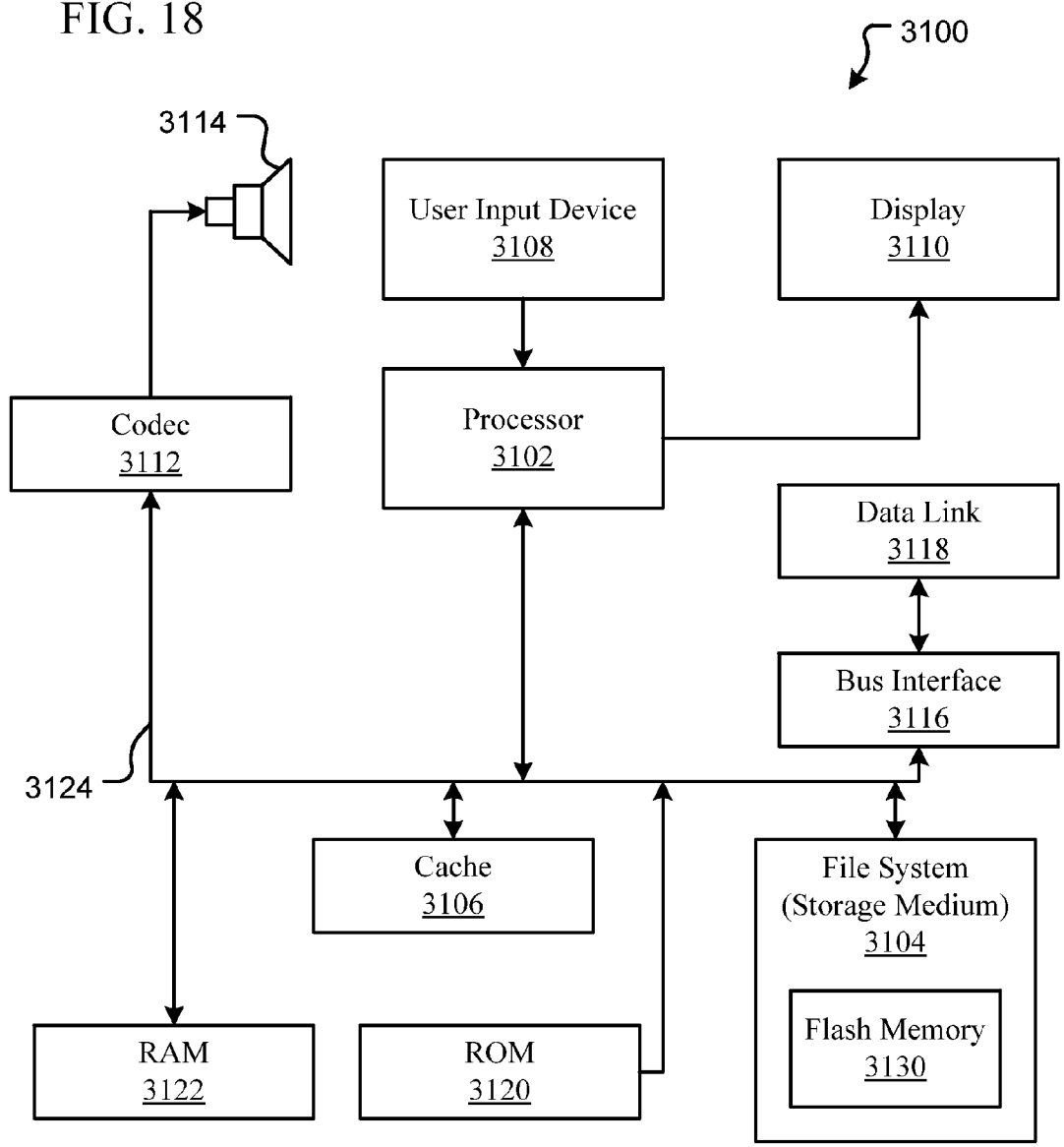
FIG. 18 illustrates an exemplary portable multimedia device, or media player, in accordance with various embodiments of the invention.

FIG. 18 shows an exemplary portable multimedia device, or media player, 3100 in accordance with an embodiment of the invention. The media player 3100 includes a processor 3102 that pertains to a microprocessor or controller for controlling the overall operation of the media player 3100. The media player 3100 stores media data pertaining to media assets in a file system 3104 and a cache 3106. The file system 3104 is, typically, a storage medium or a plurality of storage media, such as disks, memory cells, and the like. The file system 3104 typically provides high capacity storage capability for the media player 3100. Also, file system 3104 includes flash memory 3130. In the present embodiment, Flash memory 3130 can include a nonvolatile memory device with a shorter distance between the bit lines and higher storage capacity and density than those conventionally known. In various embodiments, the flash memory 3130 can be utilized with various devices, such as personal digital assistants, set-top boxes, digital video recorders, networking and telecommunication equipments, printers, computer peripherals, automotive navigation devices, gaming systems, mobile phones, cellular phones, internet protocol phones, and/or wireless phones. However, since the access time to the file system 3104 is relatively slow, the media player 3100 can also include a cache 3106. The cache 3106 is, for example, Random-Access Memory (RAM) provided by semiconductor memory. The relative access time to the cache 3106 is substantially shorter than for the file system 3104. However, the cache 3106 does not have the large storage capacity of the file system 3104. Further, the file system 3104, when active, consumes more power than does the cache 3106. The power consumption is particularly important when the media player 3100 is a portable media player that is powered by a battery (not shown). The media player 3100 also includes a RAM 3122 and a Read-Only Memory (ROM) 3120. The ROM 3120 can store programs, utilities or processes to be executed in a non-volatile manner. The RAM 3122 provides volatile data storage, such as for the cache 3106.

The media player 3100 also includes a user input device 3108 that allows a user of the media player 3100 to interact with the media player 3100. For example, the user input device 3108 can take a variety of forms, such as a button, keypad, dial, etc. Still further, the media player 3100 includes a display 3110 (screen display) that can be controlled by the processor 3102 to display information to the user. A data bus 3124 can facilitate data transfer between at least the file system 3104, the cache 3106, the processor 3102, and the CODEC 3112. The media player 3100 also includes a bus interface 3116 that couples to a data link 3118. The data link 3118 allows the media player 3100 to couple to a host computer.

In one embodiment, the media player 3100 serves to store a plurality of media assets (e.g., songs, photos, video, etc.) in the file system 3104. When a user desires to have the media player play/display a particular media item, a list of available media assets is displayed on the display 3110. Then, using the user input device 3108, a user can select one of the available media assets. The processor 3102, upon receiving a selection of a particular media item, supplies the media data (e.g., audio file, graphic file, video file, etc.) for the particular media item to a coder/decoder (CODEC) 3110. The CODEC 3110 then produces analog output signals for a speaker 3114 or a display 3110. The speaker 3114 can be a speaker internal to the media player 3100 or external to the media player 3100. For example, headphones or earphones that couple to the media player 3100 would be considered an external speaker.

In a particular embodiment, the available media assets are arranged in a hierarchical manner based upon a selected number and type of groupings appropriate to the available media assets. For example, in the case where the media player 3100 is an MP3-type media player, the available media assets take the form of MP3 files (each of which corresponds to a digitally encoded song or other audio rendition) stored at least in part in the file system 3104. The available media assets (or in this case, songs) can be grouped in any manner deemed appropriate. In one arrangement, the songs can be arranged hierarchically as a list of music genres at a first level, a list of artists associated with each genre at a second level, a list of albums for each artist listed in the second level at a third level, while at a fourth level a list of songs for each album listed in the third level, and so on.

It is noted that the components (e.g., 3102, 3104, 3120, 3130, etc.) of media player 3100 can be coupled to each other in a wide variety of ways. For example, in an embodiment, the codec 3122, RAM 3122, ROM 3120, cache 3106, processor 3102, storage medium 3104, and bus interface 3116 can be coupled to data bus 3124. Furthermore, the data link 3118 can be coupled to the bus interface 3116. The user input device 3108 and the display 3110 can be coupled to the processor 3102 while the speaker 3114 can be coupled to the codec 3112. It is pointed out that in various embodiments, the components of media player 3100 can be coupled to each other via, but are not limited to, one or more communication buses, one or more data buses, one or more wireless communication technologies, one or more wired communication technologies, or any combination thereof.

The foregoing descriptions of various specific embodiments in accordance with the invention have been presented for purposes of illustration and description. They are not intended to be exhaustive or to limit the invention to the precise forms disclosed, and obviously many modifications and variations are possible in light of the above teaching. The invention can be construed according to the Claims and their equivalents.

We claim:

1. A method of manufacturing a semiconductor device, comprising:
    forming a plurality of bit lines on a substrate;
    forming an insulating layer between the plurality of bit lines, the insulating layer comprising opposing side surfaces and wherein an upper surface of the insulating layer is higher than upper surfaces of the plurality of bit lines;
    forming a plurality of channel layers on the opposing side surfaces of the insulating layer;
    forming a tunnel oxide film over the plurality of channel layers, the tunnel oxide film comprising top, bottom, and side surfaces, wherein a portion of the tunnel oxide film is disposed over a top surface of the insulating layer;
    forming a plurality of charge storage layers on opposite side surfaces of the plurality of channel layers from the side surfaces on which the insulating film is formed; and
    forming a top oxide film over the tunnel oxide film and the plurality of charge storage layers, the top oxide film comprising top, bottom, and side surfaces,
    wherein the plurality of charge storage layers is provided between the side surfaces of the top oxide film and side surfaces of the tunnel oxide film,
    further wherein at least a portion of the bottom surface of the top oxide film is in direct contact with the top surface of the tunnel oxide film.

2. The method as claimed in claim 1, further comprising
    forming a groove at a portion of the substrate, the portion being located between the plurality of bit lines,
    wherein forming the insulating layer includes forming an insulating film in the groove.

3. The method as claimed in claim 1, further wherein the plurality of charge storage layers are formed to be no higher than the top surface of the tunnel oxide film.

4. The method as claimed in claim 1, wherein at least portion of the channel layer is disposed over the plurality of bit lines.

5. The method as claimed in claim 1, wherein the insulating layer further comprises side faces oblique with respect to a surface of the substrate.

6. The method as claimed in claim 1, wherein the plurality of charge storage layers are physically separated by the top surface of the tunnel oxide film.

7. The method as claimed in claim 1, wherein the channel layer comprises a polysilicon layer.

8. The method as claimed in claim 1, wherein the plurality of charge storage layers comprises silicon nitride films.

9. The method as claimed in claim 1, wherein the substrate is an insulating substrate.

10. The method as claimed in claim 1, further comprising: forming a plurality of word lines perpendicular to the plurality of bit lines.

11. The method as claimed in claim 10, wherein the insulating layer is interposed between the word lines and the charge storage layers.

12. The method as claimed in claim 1, wherein forming the charge storage layers includes forming charge storage layers by a sidewall technique.

13. The method as claimed in claim 1, wherein forming the plurality of charge storage layers comprises isolating two portions of a single contiguous charge storage layer from each other via etching.

14. The method as claimed in claim 1, wherein the plurality of charge storage layers includes floating gates.

\* \* \* \* \*